United States Patent
Heinenman et al.

(10) Patent No.: US 7,855,404 B2
(45) Date of Patent: Dec. 21, 2010

(54) BIPOLAR COMPLEMENTARY SEMICONDUCTOR DEVICE

(75) Inventors: Bernd Heinenman, Frankfurt (DE); Jürgen Drews, Frankfurt (DE); Steffen Marschmayer, Frankfurt (DE); Holger Rücker, Bad Saarow (DE)

(73) Assignee: IHP GmbH—Innovations for High Performance Microelectronics/Leibniz-Instituit fur Innovative Mikroelektronik, Frankfurt (DE)

( * ) Notice: Subject to any disclaimer, the term of this patent is extended or adjusted under 35 U.S.C. 154(b) by 564 days.

(21) Appl. No.: 10/581,127

(22) PCT Filed: Dec. 1, 2004

(86) PCT No.: PCT/EP2004/013855
§ 371 (c)(1),
(2), (4) Date: Sep. 25, 2008

(87) PCT Pub. No.: WO2005/055289
PCT Pub. Date: Jun. 16, 2005

(65) Prior Publication Data
US 2009/0206335 A1  Aug. 20, 2009

(30) Foreign Application Priority Data
Dec. 5, 2003 (DE) .............................. 103 58 047

(51) Int. Cl.
*H01L 29/80* (2006.01)
*H01L 31/112* (2006.01)

(52) U.S. Cl. .................. 257/274; 257/19; 257/204; 257/347; 257/E21.006; 257/E21.32; 257/E21.051; 257/E21.115; 257/E21.229; 257/E21.245; 257/E21.267; 257/E21.278; 257/E21.293; 257/E21.632

(58) Field of Classification Search .................. 257/19, 257/274, 277, 279, 288, 347, 204, E21.006, 257/51, 115, 229, 245, 267, 278, 293, 32, 257/632
See application file for complete search history.

(56) References Cited

U.S. PATENT DOCUMENTS 4,719,185 A   1/1988   Goth
(Continued)

FOREIGN PATENT DOCUMENTS

EP   0 746 038   12/2001
(Continued)

OTHER PUBLICATIONS

M. C. Wilson et al., "Process HJ: A 30 GHz NPN and 20 GHz PNP complementary bipolar process for high linearity Rf circuits," IEEE BCTM 9.4, 1998, pp. 164-167.
(Continued)

*Primary Examiner*—David Nhu
(74) *Attorney, Agent, or Firm*—Ware, Fressola, Van Der Sluys & Adolphson LLP

(57) ABSTRACT

A complementary BiCMOS semiconductor device comprises a substrate of a first conductivity type and a number of active regions which are provided therein and which are delimited in the lateral direction by shallow field insulation regions, in which vertical npn-bipolar transistors with an epitaxial base are arranged in a first subnumber of the active regions and vertical pnp-bipolar transistors with an epitaxial base are arranged in a second subnumber of the active regions, wherein either one transistor type or both transistor types have both a collector region and also a collector contact region in one and the same respective active region. To improve the high-frequency properties exclusively in a first transistor type in which the conductivity type of the substrate is identical to that of the collector region, an insulation doping region is provided between the collector region and the substrate.

23 Claims, 12 Drawing Sheets

U.S. PATENT DOCUMENTS

| | | | |
|---|---|---|---|
| 4,940,671 | A * | 7/1990 | Small et al. ............ 438/322 |
| 6,222,250 | B1 * | 4/2001 | Gomi ..................... 257/574 |
| 2002/0168829 | A1 | 11/2002 | Bock et al. |
| 2003/0146468 | A1 | 8/2003 | Gris et al. |
| 2003/0146477 | A1 | 8/2003 | Krutsick |
| 2003/0162360 | A1 | 8/2003 | Beasom |
| 2003/0219952 | A1 | 11/2003 | Fujimaki |
| 2005/0023642 | A1 | 2/2005 | Heinemann et al. |

FOREIGN PATENT DOCUMENTS

| | | |
|---|---|---|
| JP | 2000188296 | 7/2000 |
| JP | 2000269350 | 9/2000 |

OTHER PUBLICATIONS

D. Knoll et al., "A flexible, low-cost, high performance SiGe:C BiCMOS process with a one-mask HBT module," IEEE, 2002.

B. Heinemann et al., "Novel collector design for high-speed SiGe:C HBTs," IEEE, 2002.

D. V. Singh et al., "Novel epitaxial $p$-Si/$n$-Si$_{1-y}$C$_y$/$p$-Si heterojunction bipolar transistors," IEEE, 2000.

B. El-Kareh et al., "A 5V complementary -SiGe BiCMOS technology for high-speed precision analog circuits."

D. V. Singh et al., "Effect of band alignment and density of states on the collector current in p-Si/n-Si$_{1-y}$C$_y$/p-Si HBTs," IEEE Transactions on Electron Devices, vol. 50, No. 2, Feb. 2003, pp. 425-32.

Y. Chyan et al., "A 50-GHz 0.25μm implanted-base high-energy implanted-collector complementary modular BiCMOS (HEICBiC) technology for low-power wireless-communication VLSIs," IEEE BCTM 7.3, 1998, pp. 128-131.

D. L. Harame et al., "55 GHz polysilicon-emitter graded SiGe-base PNP transistors," 1991, p. 71.

T. Onai et al., "Self-aligned complementary bipolar technology for low-power dissipation and ultra-high-speed LSIs," IEEE Transactions on Electron Devices, vol. 42, No. 3, Mar. 1995, pp. 413-418.

S. J. Jeng et al., "A 210-GHz $f_T$ SiGe HBT with a non-self-aligned structure," IEEE Electron Device Letters, vol. 22, No. 11, Nov. 2001.

J. D. Cressler et al., "A high-speed complementary silicon bipolar technology with 12-fJ power-delay product," IEEE Electron Device Letters, vol. 14, No. 11, Nov. 1993, pp. 523-526.

W. Klein et al., "75 GHz bipolar production technology for the 21st century," pp. 88-94.

* cited by examiner

BIPOLAR COMPLEMENTARY SEMICONDUCTOR DEVICE

CROSS REFERENCE TO RELATED APPLICATIONS

This application is for entry into the U.S. national phase under §371 for International Application No. PCT/EP2004/013855 having an international filing date of Dec. 1, 2004, and from which priority is claimed under all applicable sections of Title 35 of the United States Code including, but not limited to, Sections 120, 363 and 365(c), and which in turn claims priority under 35 USC §119 to German Patent Application No. 103 58 047.6 filed on Dec. 5, 2003.

BACKGROUND OF THE INVENTION

1. Technical Field

The invention concerns a complementary bipolar semiconductor device, hereinafter also referred to as a CBi semiconductor device, comprising a substrate of a first conductivity type and a number of active regions which are provided therein and which are delimited in the lateral direction by shallow field insulation regions, in which vertical npn-bipolar transistors with an epitaxial base are arranged in a first subnumber of the active regions and vertical pnp-bipolar transistors with an epitaxial base are arranged in a second subnumber of the active regions, wherein either one transistor type or both transistor types have both a collector region and also a collector contact region in one and the same respective active region. The invention further concerns a process for the production of such a complementary bipolar semiconductor device.

The present application fully incorporates German patent application No DE 103 58 047.6 of 5.12.1003, the priority of which is claimed, in the sense of an 'Incorporation by Reference' in pursuance of American law.

2. Discussion of Related Art

The operational efficiency of bipolar transistors (also referred to in English as a bipolar junction transistor or BJT) on a silicon base has been substantially improved in the high-speed area by the use of a heterobase layer which is produced by means of epitaxy. A further impetus in terms of power has been implemented in the case of npn-heterobipolar transistors (HBTs) by the additional incorporation of carbon into a boron-doped base of silicon-germanium (SiGe).

For reasons relating to circuitry engineering it is often advantageous to have npn- and pnp-transistors on a chip at the same time.

In addition integration with complementary metal oxide semiconductor (CMOS) transistors can also afford additional advantages.

Essential features of a high-speed bipolar transistor with an epitaxial base, which can be inexpensively produced, are set forth in WO 03/046948 A2. The transistor described therein permits in particular simplified integration either of an npn- or a pnp-high-speed HBT in CMOS technology. Such technology is referred to as BiCMOS technology. It is not possible to see from WO 03/046948 A2 however how npn- and pnp-transistors can be integrated jointly in a CBi conductor device.

In the case of pnp-heterobipolar transistors (pnp-HBTs) which operate in the high-speed range, the advances in past years have been rather slight in comparison with the advances in terms of further development of npn-HBTs, in particular npn-SiGe-HBTs. The following reasons are primarily to be named for those slight advances in improvement in the high-speed properties of pnp-HBTs:

a) Good high frequency properties in the case of npn-transistors fit in with the type of the heterojunction of Si/SiGe, while that kind of heterojunction can adversely affect the operational efficiency of pnp-transistors, see D V Singh, J L Hoyt and J F Gibbons: 'Novel epitaxial p-Si/n-Si$_{1-y}$C$_y$/p-Si heterojunction bipolar transistors', IEDM 2000, pages 749-752 or D V Singh, J L Hoyt and J F Gibbons: 'Effect of band alignment and density of states on the collector current in p-Si/n-Si$_{1-y}$C$_y$/p-SiHBTs', IEEE Trans. Electron. Devices, Vol 50, pages 425-432, February 2003.

b) By virtue of the deposit and diffusion properties of the respective dopants, the demands on the doping profile of npn-high-speed transistors can be more easily satisfied in a BiCMOS process, than those for a pnp-transistor.

c) The process complexity of conventional complementary bipolar or BiCMOS processes is so great and the mutual influence of the process modules on device parameters is so considerable that there are few approaches which aim at an improvement in the high frequency properties of pnp-transistors in a CBIMOS semiconductor device.

Design features, corresponding to the present day state of the art, in respect of complementary bipolar transistors and process steps of a complementary SiGe-BiCMOS technology are published in B El-Kareh, S Balster, W Leitz, P Steinmann, H Yasuda, M Corsi, K Dawoodi, C. Dirnecker, P Foglietti, A Haesler, P Menz, M Ramin, T Scharnagl, M Schiekofer, M Schober, U Schulz, L Swanson, D Tatman, M Waitschull, J W Weijtmans and C Willis: 'A 5V complementary-SiGe BiCMOS technology for high-speed precision analog circuits', BCTM pages 211-24, 2003 (hereinafter El-Kareh et al). The solution described therein aims at lowest possible parasitic capacitances and a collector resistance which is as low as possible.

Small collector substrate capacitances are implemented by means of deep trenches filled with insulator material and with a buried oxide layer using SOI technology ('silicon on insulator'). In addition the buried oxide layer in conjunction with the deep trenches ensures electrical insulation of the collectors in relation to the substrate. In order to keep down the collector resistances, El-Kareh et al use epitaxially buried, highly doped collector layers and special implantation steps for a low-ohmic connection of the buried collector layers, referred to as 'collector sinkers'. El-Kareh et al, with that technology, attain limit frequencies $f_T/f_{max}$ of 19/60 GHz for npn-transistors and 19/45 GHz for pnp-transistors.

A disadvantage of that process however is that typical modern CMOS technologies do not include either epitaxially buried collector layers or deep insulation trenches or collector sinkers. The process expenditure for those process steps is in part considerable. As the CMOS transistors are introduced into the epitaxy layer which is deposited over the buried collector layers, an additional heat loading of the buried collector layers used by El-Kareh et al during the CMOS process cannot be avoided. That reduces the profile gradient of the buried collector layers, whereby the efficiency of both bipolar transistor types but in particular that of the pnp-transistors in the high-speed range is adversely affected.

Furthermore the process described by El-Kareh et al suffers from the disadvantage that process steps for CMOS and bipolar devices are coupled. Thus, a gate polysilicon layer stack is produced, which results from two polysilicon deposit operations. The second polysilicon layer is produced during deposit of the base of the npn-bipolar transistors in the form of a p-doped polycrystalline SiGe layer. That is intended to pursue the aim of keeping down the level of process complication and expenditure and thus the complexity and cost of the proposed complementary BiCMOS technology. The disadvantage of that process however is that the interchangeability, which is usually an aim to strive for, of process modules, for example the replacement of an aged CMOS generation by a fresh one, is impeded in that way.

As mentioned above, the use of an SOI substrate in combination with deep trenches admittedly still affords the advantage of permitting electrical insulation of the bipolar transistors without further technological expenditure. In addition the collector-substrate capacitance can be kept comparatively low. SOI substrates however suffer in particular from the disadvantage that dissipation of the heat produced in operation of the transistor is made considerably more difficult, in comparison with standard substrates. That disadvantage causes additional self-heating of the transistors under the operating conditions in the high-speed range and thus leads to a reduction in the power potential.

In addition, the Si-layers present in the case of El-Kareh et al on the buried oxide layer of the SOI substrate in a vertical configuration are too powerful to be able to produce MOS transistors which are optimised without difficulties, for example so-called 'fully depleted MOS transistors', on an SOI substrate. Integration of the complementary bipolar transistors with a CMOS technology which was developed for standard substrates requires additional expenditure solely because of changing over to the SOI substrate.

In the publication by M C Wilson, P H Osborne, S Nigrin, S B Goody, J Green, S J Harrington, T Cook, S Thomas, A J Manson, A Madni: 'Process H J: A 30 GHz NPN and 20 GHz PNP complementary bipolar process for high linearity RF circuits', pages 164-167, BCTM 1998, the use of an SOI substrate is dispensed with and the electrical insulation of the bipolar transistors in a vertical direction is achieved by means of a special insulation doping. Deep trenches are used for lateral insulation.

The arrangement put forward by Wilson et al however suffers from the decisive disadvantage that both the vertical and also the lateral interface between the collector or collector connection region and the special insulation doping contribute to the parasitic collector capacitance of the pnp-transistor. Because of the high parasitic collector capacitance, the transistor of Wilson et al is therefore unsuited to an improvement in the high-speed parameters. Furthermore the special doping used by Wilson et al requires an additional masking step.

Finally, Wilson et al, just like El-Kareh et al, involve the use of epitaxially buried collector layers and sinker dopings for the collector connection, thereby giving rise to the above-indicated disadvantages in terms of CMOS integration. That concerns in particular the fact that the epitaxially buried collectors have to be produced in the course of the process prior to the field insulation and well regions of the CMOS transistors and thus the implementation of steep profiles is greatly impeded. In this connection mention is to be made of the fact that integration of the described complementary bipolar transistors in a CMOS process is not subject-matter of the work by Wilson et al.

Therefore the technical object of the invention is to provide a complementary bipolar semiconductor device of the kind set forth in the opening part of this specification, in which both bipolar transistor types have advantageous properties for high-speed uses. A further technical object of the invention is to provide a process for the production of a bipolar semiconductor device, with which the described disadvantages of known processes can be avoided, in particular in regard to the integration of the production of the complementary bipolar transistors in a CMOS technology.

DISCLOSURE OF INVENTION

In accordance with a first aspect of the invention the technical object is attained by a complementary bipolar semiconductor device comprising a substrate of a first conductivity type and a number of active regions which are provided thereon and which are delimited in the lateral direction by shallow field insulation regions, in which vertical npn-bipolar transistors with an epitaxial base are arranged in a first subnumber of the active regions and vertical pnp-bipolar transistors with an epitaxial base are arranged in a second subnumber of the active regions, wherein either one transistor type or both transistor types have both a collector region and also a collector contact region in one and the same respective active bipolar transistor region.

In the complementary bipolar semiconductor device according to the invention, exclusively in a first transistor type in which the conductivity type of the substrate is identical to that of the collector region an insulation doping region is provided between the collector region and the substrate. The insulation doping region is adapted to provide electrical insulation of the collector and the substrate.

In accordance with the invention in the first transistor type in the region of an interface between the collector region and the insulation doping region there is a p-n junction which is arranged no deeper at the edge defined by the field insulation region of the active bipolar transistor region in question, alternatively in the whole of the respective active bipolar transistor region, than the lower edge of the shallow field insulation regions.

Furthermore in accordance with the invention the collector region either of the first transistor type or both transistor types is delimited laterally by the shallow field insulation regions.

Some terms which are used to describe the transistor according to the invention are firstly explained in greater detail hereinafter.

The complementary bipolar semiconductor device according to the invention is also referred to in the course of this application for the sake of brevity as a CBi semiconductor device.

The term active bipolar transistor region is used to denote the semiconducting substrate region which extends in the cross-sectional profile between two adjacent field insulation regions and in which the essential functional structural elements of the bipolar transistor, namely base, emitter and collector are arranged.

An active bipolar transistor region is a special case of an active region. The term active region is used to denote generally a semiconducting substrate region which extends in the cross-sectional profile between two adjacent field insulations and in which functional structural elements of the CBi semiconductor device are arranged.

As an example to distinguish between the two terms 'active bipolar transistor region' and 'active region', reference will be made to the example of the collector contact region of the CBi semiconductor device according to the invention. In the case of one transistor type it is arranged in the same bipolar transistor region as the collector. In contrast in the case of the other transistor type it can also be arranged in another active region. That other active region in that case however is not an active bipolar transistor region because it does not include base, emitter and collector of the bipolar transistor in question.

The term shallow field insulation region which is usual in CMOS technology denotes a trench-shaped insulation region which terminates approximately flush with the substrate surface and which is of a depthwise extent of typically between 300 and 600 nm in the direction of the interior of the substrate. Shallow field insulation regions, since the introduction of 0.25 µm CMOS technology, are typically produced using the so-called shallow trench technology. The trenches of the shallow field effect regions can be filled for example with silicon dioxide or with a combination of a plurality of insulator materials.

The features and advantages of the CBi semiconductor device according to the invention are described in greater detail hereinafter.

In contrast to known complementary bipolar semiconductor devices which are optimised in terms of their high frequency suitability, the CBi semiconductor device according to the invention provides in a simple manner for integration of the production of both bipolar transistor types with particularly good high frequency properties in a CMOS process.

In accordance with the invention the integration of both transistor types in a CMOS process is facilitated by virtue of the fact that, in that transistor type in which the conductivity type of the collector region is the same as that of the substrate, arranged between the collector region and the substrate is an insulation doping region which produces the vertical insulation of that transistor type, wherein vertical insulation is to be interpreted as insulation in relation to the substrate regions which are in the direction of the interior of the substrate.

The transistor type in which the conductivity type of the collector region is the same as that of the substrate is also referred to herein as the 'first transistor type' or 'first bipolar transistor type'. If for example the substrate is p-conducting then the first transistor type is a pnp-transistor.

In accordance with the invention the required lateral insulation of the collector of that bipolar transistor type or both bipolar transistor types is implemented by shallow field insulation regions, in particular field insulation regions using MOS technology. In the CBi semiconductor device according to the invention therefore, besides delimiting active regions from surrounding substrate regions, the shallow field insulation regions implement lateral insulation of the collector, as an additional function. Lateral delimitation of the collector region by the field insulation regions provides low capacitance values between the collector of the respective transistor and the lateral surroundings or the surroundings at the substrate side. Low capacitance values promote the high frequency suitability of the bipolar transistors.

Furthermore in accordance with the invention in the first transistor type provided in the region of an interface between the collector region and the insulation doping region is a p-n junction which at the edge, defined by the field insulation regions, of the active bipolar transistor region in question, alternatively in the entire respective active bipolar transistor region, is arranged no deeper than the lower edge of the shallow field insulation regions. The slight lateral extent of the collector region reduces the collector resistance. Furthermore that measure permits the space charge zone between the collector region and the insulation doping region to be of small area, whereby the collector-substrate capacitance is further reduced. Lateral delimitation of the p-n junction by the shallow field insulation regions is essential for that purpose.

In the first stated alternative configuration the p-n junction at the edge defined by the field insulation regions, of the active region in question, is arranged no deeper than the lower edge of the shallow field insulation regions. In other words the p-n junction between the collector region and the insulation doping region towards the center of the active region can also be arranged deeper, that is to say further towards the interior of the substrate, than the lower edge of the field insulation regions. The p-n junction can for example be in the form of an inverted bell.

In the second stated configuration of this embodiment however the p-n junction is arranged over the entire lateral extent of the active region, at a depth which does not extend beyond that of the field insulation regions at the edge of the active region. In that configuration the capacitance values are particularly low, which is especially advantageous for the high-speed parameters of the first transistor type.

The feature of the insulation doping and the feature of the lateral insulation by the shallow field insulation regions each form respective inventions which are independently worthy of protection and which can also be implemented independently of each other in a bipolar transistor. The insulation doping region, in the vertical direction, produces the electrical insulation of the collector of the first bipolar transistor type relative to the substrate. The field insulation regions provide for lateral insulation of the collector. Basically both features can be combined with respective other insulation solutions which are previously known for the vertical and lateral insulation of the collector respectively. However the effect of those two measures is particularly advantageous in combination in the invention claimed herein.

With the CBi semiconductor device according to the invention there is no need for the first bipolar transistor type to be arranged in an epitaxy layer which is deposited prior to the essential production processes for MOS transistors and over a well previously doped with an extra masking step, as is the case with known BiCMOS processes. The complicated and expensive manufacture of a buried oxide layer and deep trenches filled with oxide for insulation of the collector regions from the substrate is also redundant in that way.

In addition the arrangement according to the invention permits the production of highly conductive and low-capacitance collector regions even after production of essential elements of a MOS technology such as production of the field insulation, the well regions and the MOS gates. That provides that the collector regions are subjected to a particularly low level of thermal stress in the further course of the production procedure. Thus the steepness of the collector profiles which is to be found after the implantation operation can be preserved during the remaining process steps of a CBiCMOS process. That therefore provides better prerequisites for high frequency transistors in a CBiCMOS technology.

The implementation of low-defect, highly doped collector regions is important for use of the arrangement according to the invention in circuits. Methods of producing low-defect, highly doped regions, applied previously in the context of BiCMOS technology, require heat treatments at temperatures which can detrimentally influence the properties of well profiles of the MOS transistors or base profiles of the bipolar transistors. That is avoided in the production of the CBi semiconductor device according to the invention by specifically used amorphising implantation operations. They secure low-defect annealing of the implants at sufficiently low temperatures.

The arrangement of a collector region and a collector contact region in one and the same region in the CBi semiconductor device according to the invention makes it possible in a simple but highly effective manner to achieve low collector resistances and collector-substrate capacitances. Furthermore the use of an epitaxial base in the bipolar transistor types is beneficial in terms of achieving good high frequency properties.

The device according to the invention can be produced without disadvantages for the transistor modules involved on SOI substrates with very thin Si cover layers which in particular can involve cover layers of less than 50 nm. In particular the dissipation of heat which is worsened in known arrangements by virtue of buried oxide layers is eliminated. The increase in the thickness of the Si cover layers during the production of epitaxially buried collectors also does not occur with the device according to the invention. The device according to the invention can therefore be easily combined with the so-called 'fully depleted' MOS transistors.

The CBi semiconductor device according to the invention has already been produced in the context of CBiCMOS technology with pnp-transistors which exhibit $f_T/f_{max}$-values of 80 GHz/120 GHz and npn-bipolar transistors of values of 180 GHz/185 GHz. That is an improvement by a factor of about 2 over the state of the art known at the present time.

Embodiments of the CBi semiconductor device according to the invention are described hereinafter.

In an embodiment the high-speed parameters of the first transistor type are further improved by a low level of concentration of the insulation doping in the space charge region in the collector direction, that is to say near the collector. In general terms in that connection the reference to 'in the collector direction' or 'near the collector' is used to denote a region which is at a spacing of between 0.05 µm and 2 µm from the collector. What is to be interpreted in each specific case as near the collector depends however on the level of dopant concentration. That is explained hereinafter.

A doping profile of the insulation doping of this embodiment in which the concentration of the dopant used for insulation doping is plotted as a function of the position in the substrate between the collector and the substrate-side pn-junction of the insulation doping shows a low concentration in the collector direction. The following examples show the relationship between the level of dopant concentration and the extent of the region near the collector: the dopant concentration of that region near the collector is preferably less than $1 \times 10^{-7}$ cm$^{-3}$. In that respect the region near the collector embraces a region at a spacing of between 0.1 µm and 0.5 µm from the collector. In a further embodiment the dopant concentration of the region near the collector is limited at a maximum to $1 \times 10^{16}$ cm$^{-3}$. In that respect the region near the collector embraces a region at a spacing of between 0.2 and 1 µm from the collector. In another embodiment the dopant concentration of the region near the collector is further limited to less than $1 \times 10^{15}$ cm$^{-3}$. In that case the region near the collector involves a region at a spacing of between 0.4 and 2 µm from the collector. The dopant concentration can increase towards the substrate-side pn-junction. With the specified profiles by way of example, it is possible to achieve particularly low capacitance values and thus particularly good high-frequency properties.

In a particularly preferred embodiment of the CBi semiconductor device according to the invention, provided in the first transistor type in the adjacent active region is a well of the second conductivity type opposite to the first conductivity type, and a contact region associated therewith of the second conductivity type. Reference is firstly directed to FIG. 1 to illustrate this embodiment. There the well is identified by reference 4 and the contact region by reference 112. By means of that structure it is possible to keep down the connection resistance of the insulation doping. The reduction in the connection resistance of the insulation doping causes a further improvement in the high-frequency properties of the first transistor type. In a preferred embodiment the well is a well of the second conductivity type. In particular the well can be a well produced in a MOS process.

The collector doping is preferably so selected that a low level of collector resistance results. The implantation dose can be in the range of between $1 \times 10^{13}$ cm$^{-2}$ and $8 \times 10^{10}$ cm$^{-2}$, preferably between $2.5 \times 10^{14}$ cm$^{-2}$ and $5 \times 10^{15}$ cm$^{-2}$, restrictedly between $2.5 \times 10^{14}$ cm$^{-2}$ and $1 \times 10^{15}$ cm$^{-2}$ and still more restrictedly between $2.5 \times 10^{14}$ cm$^{-2}$ and $5 \times 10^{14}$ cm$^{-2}$. A second preferred dose range is between $1 \times 10^{15}$ cm$^2$ and $5 \times 10^{15}$ cm$^{-2}$. In order to achieve a low collector resistance a rise which is abrupt as possible in the doping of the collector region on the emitter-side flank of the profile is also advantageous. In that respect the doping profile of the collector region is preferably such that after all diffusion steps at the base-side flank the concentration increases within less than 150 nm at least by two orders of magnitude, preferably within less than 80 nm by at least two orders of magnitude, still further restrictedly within less than 40 nm by at least two orders of magnitude. By way of example the collector doping can increase from a reference level of at least $1 \times 10^{17}$ cm$^-$. The increase in the dopant concentration by at least two orders of magnitude over the specified depth regions is preferably effected in such a way that the portion of the collector profile, which is distinguished in that way, begins at the collector-side base limit.

The dopant dose of the well is preferably between $5 \times 10^{12}$ cm$^{-2}$ and $5 \times 10^{14}$ cm$^{-32}$, particularly preferably between $1 \times 10^{13}$ cm$^{-2}$ and $2 \times 10^{14}$ cm$^{-2}$.

The dopant concentration of the contact region is preferably between $1 \times 10^{17}$ cm$^{-3}$ and $1 \times 10^{21}$ cm$^{-3}$.

A further reduction in the resistance value is achieved in an embodiment in which the well and the contact region surround the insulation doping region laterally at two or alternatively three or alternatively four sides.

A further optimisation in the high frequency properties of both transistor types is achieved by a particular configuration for the collector doping. The maximum dopant concentration in the collector contact region of the first transistor type is preferably between $1 \times 10^{18}$ cm$^{-3}$ and $5 \times 10^{20}$ cm$^{-3}$. The same maximum dopant concentration is preferably used in the collector contact region of the second transistor type.

The first or the second transistor type or both transistor types preferably involve SIC doping. An inner base region of the respective transistor defines a lateral extent, with which beneath same there is arranged a second collector region (also referred to as SIC doping) which with the same conductivity type is more highly doped than at least one portion of the collector region, said portion adjoining the second collector region.

The base can also be further optimised in regard to high frequency suitability. In a preferred embodiment the epitaxial base has a base layer stack comprising a plurality of layers which are monocrystalline in the inner base region and polycrystalline in portions which are outside the inner base region in the lateral direction and which hereinafter are referred to as the base contact region. Production of that layer structure is effected for example firstly by means of selective epitaxy in a window over the collector region and then by means of differential epitaxy.

A functional base layer provided in the base layer stack can be particularly advantageously introduced in silicon or silicon-germanium. If it is introduced in silicon it is preferably of a thickness of between 1 and 100 nm, in particular between 1 and 35 nm. If the functional base layer is introduced in silicon-germanium (SiGe) the thickness of the SiGe layer can be between 1 and 150 nm, in particular between 2 and 50 nm. Insofar as the expression 'the base layer' is used in this application, that means the functional base layer, unless expressly stated to be something else.

Preferably the base layer stack includes a cover layer adjoining the base layer at the emitter side.

Particularly preferably one or more of the layers of the base layer stack is or are doped with carbon. The dopant concentration in the carbon-doped layers can be increased in that way, which provides for a reduction in the resistance and is beneficial to the high frequency properties of both bipolar transistor types.

The first, the second or both transistor types can include a T-shaped emitter. An embodiment which is particularly advantageous because it is simple to produce provides that a substrate-side portion of the base contact region, which is provided in the base layer stack of the first transistor type, is made from the same, simultaneously deposited polycrystalline semiconductor material as a base-side, outer portion of the transverse bar of the T-shape of the emitter in the second transistor type.

A further simplification is achieved if an emitter-side vertical layer portion of the base contact region, which layer portion is provided in the base layer stack of the first transistor type, is made from the same simultaneously deposited polycrystalline semiconductor material as a contact-side vertical layer portion of the transverse bar of the T-shape of the emitter in the second transistor type.

The above-indicated embodiments provide that
in the first transistor type the polycrystalline base contact region in the base layer stack has an interface which extends in parallel relationship with the substrate surface and along which grain boundaries of the here mutually adjoining base-side and emitter-side, polycrystalline, vertical layer portions are oriented, and
in the second transistor type the emitter has an interface which extends parallel to the substrate surface and along which grain boundaries in the here mutually adjoining base-side and contact-side, polycrystalline, vertical layer portions are oriented.

Preferably the shallow field insulation regions are in the form of shallow trenches. Alternatively the field insulation regions can also be produced by means of LOCOS insulation or other known processes.

A particularly preferred embodiment of the invention is a CBiMOS or CBiCMOS semiconductor device. In other words the CBi semiconductor device has at least one MOS semiconductor component or complementary MOS semiconductor components.

In a further preferred embodiment the substrate is p-conducting and the first transistor type is a pnp-transistor and the second transistor type is an npn-transistor.

In accordance with a second aspect of the invention the object is attained by a process for the production of complementary, high frequency-suited bipolar transistors in the context of a CMOS process and in a semiconductor device in accordance with the first aspect of the invention
in which the layers of both bipolar transistor types are deposited in a bipolar process module introduced into the CMOS process on active regions of a substrate of a first conductivity type, which is pre-structured by shallow field insulation regions, and structured,
in which in one or both bipolar transistor types a collector region and a collector contact region are produced within one and the same active region,
in which in that bipolar transistor type whose collector region is of the same conductivity type as the substrate an insulation doping region is produced beneath the collector region in an implantation step in such a way that the collector region is electrically insulated from the substrate, and
in which the implantation step is carried out in such a way that in the region of an interface between the collector region and the insulation doping region there is produced a pn-junction which at the edge, defined by the field insulation regions, of the active bipolar transistor region in question, alternatively in the entire respective active bipolar transistor region, is arranged no deeper than the lower edge of the shallow field insulation regions.

The process according to the invention makes it possible to produce the CBi semiconductor device in accordance with the first aspect of the invention. The process is distinguished by a comparatively low level of complexity. In addition the bipolar process module is independent of the CMOS process. Therefore both processes can be easily integrated in a CBiCMOS process and also optimised independently of each other. Further advantages of the process according to the invention will be apparent from the representation of the advantages of the CBi semiconductor device in accordance with the first aspect of the invention.

Preferred embodiments of the process of the second aspect of the invention are described hereinafter.

In a preferred embodiment of the process according to the invention, besides the implantation step for producing the collector region, a further implantation step is carried out for at least partially amorphising the collector region. Preferably after the implantation step a step for recrystallisation of the collector region is carried out. These embodiments make it possible to produce the collector region with a low defect density. The recrystallising step is preferably carried out by rapid thermal annealing at a sufficiently low temperature.

The process according to the invention is carried out in a particularly simple manner if a substrate-side layer portion of the base contact region, which is provided in the base layer stack of the first transistor type, is deposited at the same time as a base-side layer portion of the transverse bar of the T-shape of the emitter in the second transistor type. In that case it can be that the corresponding layer portion of the transverse bar of the T-shape of the emitter contains a silicon-germanium sublayer, as that is so provided in the base layer stack of the first transistor type. That however is not detrimental in terms of the electrical properties of the emitter of the second transistor type. For in a subsequent process step that emitter layer portion is opened in the region of the emitter window so that only outer layer portions of the emitter are made from that material. They do not have any substantial influence on the electrical properties of the emitter of the second transistor type.

In a further embodiment an emitter-side layer portion of the base contact region, which layer portion is provided in the base layer stack of the first transistor type, is deposited at the same time as a contact-side layer portion of the transverse bar of the T-shape of the emitter in the second transistor type. That measure also provides an additional simplification in the bipolar process module.

The bipolar process module is preferably carried out in the context of the CMOS process subsequently to a gate structuring operation and a formation of gate spacers and prior to the implantation of source and drain regions.

The process according to the invention can be used without disadvantages for the transistor modules involved on SOI substrates, in particular SOI substrates with very thin (for example <50 nm) Si cover layers.

BRIEF DESCRIPTION OF THE DRAWINGS

Further features and advantages of the invention will be apparent from the description hereinafter of embodiments by way of example with reference to the Figures in which.

DETAILED DESCRIPTION

Four examples are described hereinafter with reference to the respectively specified Figures.

Example 1

Figure 1:
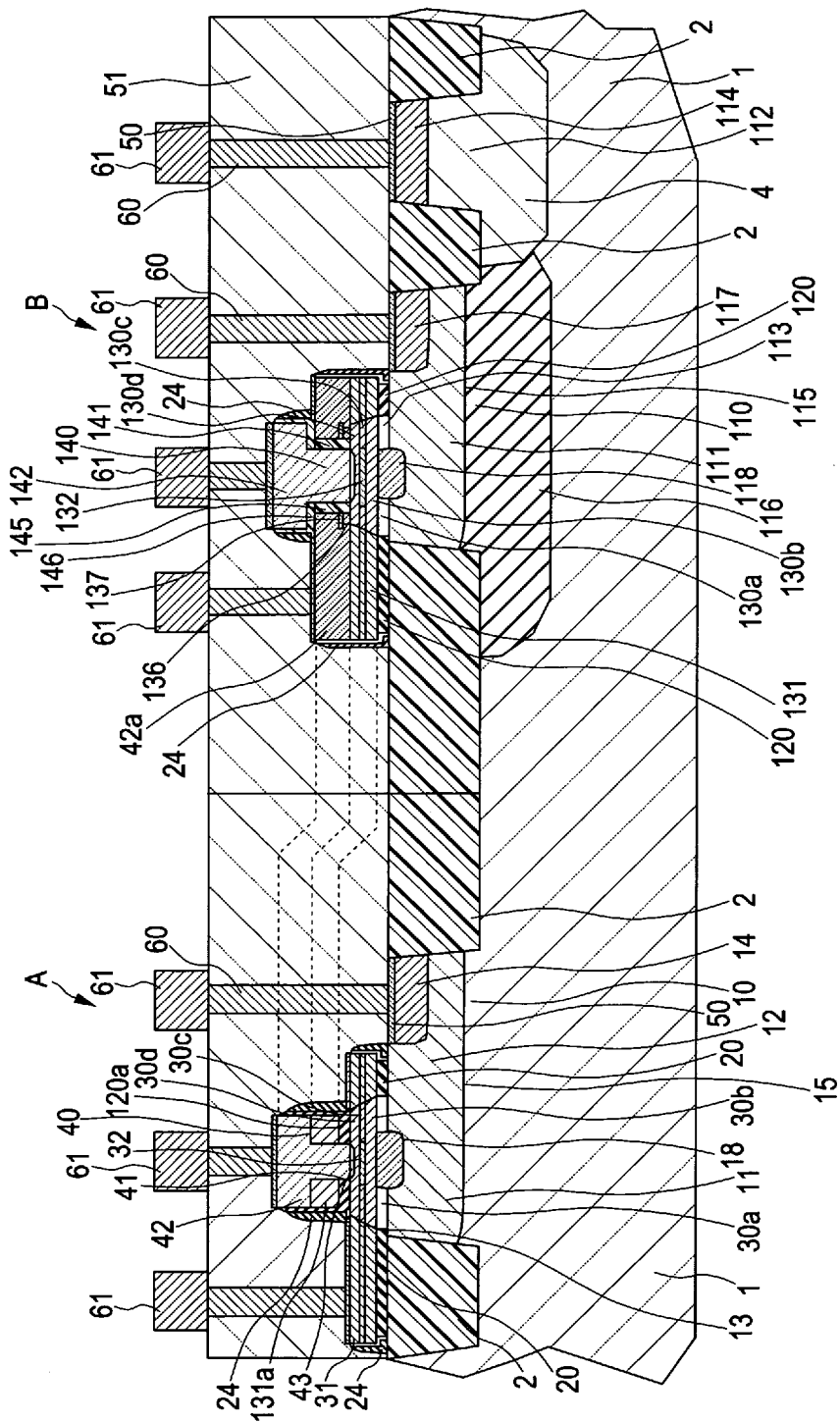
FIG. 1 shows a cross-section of the complementary bipolar transistors according to the invention.

An embodiment of the semiconductor device according to the invention which includes complementary bipolar transistors with an epitaxial base is now described with reference to FIG. 1. In this example an npn-bipolar transistor A and a pnp-bipolar transistor B are produced on a high-ohmic monocrystalline p⁻-conductive Si substrate 1. The arrangement described here is not restricted to p⁻-conductive Si substrates. The essential features can also be transferred to substrates of the opposite conductivity type. At the same time CMOS transistors can also be present on the substrate 1, but are not shown in FIG. 1.

The npn-bipolar transistor A with an epitaxial base includes an n-conducting collector 11 and an also n-conducting emitter 40. The collector is passed for contact laterally by way of the collector contact region 12 and a collector connection doping 14.

In the vertical direction between the emitter 4 and the collector 11 is a monocrystalline layer stack 30 which is continued laterally in the form of a polycrystalline layer stack 31. The layer stack 30 contains a p-conducting base layer 30c. An inner base layer 32 is defined as a portion of the base layer 30c in a horizontal direction approximately by the width of the emitter window 41. Laterally the inner base layer 32 is connected by way of a monocrystalline region of the base layer 30c and further outwardly by way of the highly conductive layer 31.

A first kind of insulation regions 2 referred to hereinafter as shallow field insulation regions or simply just as field insulation regions, projects into the interior of the substrate from the substrate surface. So-called shallow trench insulations can be used as the field insulation regions. These involve trenches which are preferably between 300 and 600 nm in depth and which can be filled for example with silicon dioxide ($SiO_2$) but also with a combination of insulator material and polysilicon. Alternatively it is also possible to use field insulation regions produced by means of local oxidation (LOCOS). In addition to the shallow field insulation regions, it is also possible to use deep trenches filled for example with $SiO_2$ which however are not provided in the arrangement shown in FIG. 1.

Provided between the field insulation regions 2 at the substrate surface are islands of monocrystalline silicon regions, the so-called active regions. The npn-bipolar transistor with epitaxial base is arranged in an active bipolar transistor region 10. It includes a collector 11 which is disposed in the substrate and which is delimited laterally by the side walls of the field insulation regions 2. Insulation regions of the second kind 20 are produced on the substrate surface. These involve an $SiO_2$ layer which is between 1 nm and 150 nm in thickness, preferably between 30 and 150 nm in thickness. It is however also possible to use layer stacks comprising different insulator materials, for example $SiO_2$ layers with a different etching rate in dilute hydrofluoric acid or a combination of $SiO_2$ and silicon nitride $Si_3N_4$. The insulation regions of second kind can also be covered with a conductive layer, for example highly doped polysilicon. In the example shown in FIG. 1 the insulation region of second kind 20 comprises 2 subregions. One of those is disposed both on the field insulation region 2 and also on the active region while the second is disposed completely on the active region.

The collector of the npn-transistor 11 is covered with a monocrystalline layer stack 30 which is produced in an epitaxy step. The layer stack 30 is composed of four layers 30a-30d described hereinafter. The collector window 13 in the insulation region of second kind over the collector 11 is filled by the monocrystalline Si layer 30a. It can be of a thickness of between 20 nm and 150 nm, preferably between 30 nm and 100 nm. The buffer layer 30b is produced by differential growth. That layer can be between 5 nm and 70 nm in thickness, preferably between 10 nm and 50 nm in thickness. The p-doped base layer 30c is produced above the buffer layer. The thickness of the base layer can be between 5 nm and 100 nm, preferably between 5 nm and 35 nm. A cap layer 30d which is between 10 nm and 100 nm, preferably between 20 nm and 50 nm thick, follows over the base layer.

The base 30c can preferably be introduced into an alloy of SiGe. In addition carbon can be incorporated during the epitaxy operation in the buffer layers 30a, b or in the base layer 30c or in the cap layer.

Disposed above the layer stack 30, 31 is a structured insulator layer 120a. That can preferably comprise an SiO$_2$ layer which is between 10 nm and 150 nm and preferably between 30 and 120 nm in thickness. It can however also be composed of a combination of different insulator materials.

The opening in the insulator layer 120a over the layer stack 30 defines the emitter window 41. The polysilicon layer 131a has been structured by means of a lacquer mask to produce the emitter window 41. That so-called hard mask is used to transfer the emitter window into the insulator layer 120a in a wet etching step.

A highly doped silicon layer of the conductivity type of the collector, the npn-emitter layer 42, covers the emitter window 41 and the polysilicon layer 131a. The npn-emitter layer 42 can be deposited in the form of polycrystalline, amorphous, partially monocrystalline, partially polycrystalline or monocrystalline material. During a high-temperature step n-dopant can be diffused out of the highly doped npn-emitter layer 42 into the layer stack 30 through the emitter window 40 and into the polysilicon layer 131a. In that case the emitter 40 includes the npn-emitter layer 42, the polysilicon layer 131a and the diffused n-region 43. The resulting lateral extent of the npn-emitter layer 42 is preferably of such a configuration by way of etching by way of a lacquer mask that the side surfaces of the npn-emitter layer project laterally beyond the inner side surfaces of the insulation regions of second kind 20. In that way, after etching of the npn-emitter layer 2, doping of the layer stack 31 of the conductivity type of the base can be effected by implantation in such a way that the offshoots of that implantation operation are kept away from the collector 1. The layer 31 is structured by way of a lacquer mask. Then the npn-emitter layer 42 as well as the insulator layers of second kind 20 and the layer 21 are provided at the side walls with a spacer comprising a double layer SiO$_2$/Si$_3$N$_4$ 24.

After the spacer formation the active regions covered with an SiO$_2$ residual layer which is preferably between 1 nm and 20 nm are etched free in a wet chemical procedure. A subsequent silication step produces the silicide layers 50 which are even better conductive in comparison with highly doped Si. The surface of the transistor and insulation regions is covered by an insulator layer or layer combination 51. Contact holes 60 filled with conductive material and metal strips 61 disposed thereover produce the electrical connection to the contact regions of the transistor.

The pnp-bipolar transistor B with epitaxial base has a p-conducting collector 110 and an also p-conducting emitter 140. The collector is taken laterally by way of a collector contact region and a collector connection doping 117 to the collector contact 60, 61.

Arranged between the collector 110 and the emitter 140 is a monocrystalline layer stack which is then extended laterally in the form of a polycrystalline layer stack 131. Starting from the collector the monocrystalline layer stack has a monocrystalline Si layer 130a, a buffer layer 130b, a base layer 130c and a cover layer 130d. The cover layer 130d is also referred to as the cap layer.

The base layer 130c is n-conducting. It has an inner base layer 142 which in the lateral direction extends approximately over the width of the emitter window 141. As in the case of the npn-transistor A, adjoining the inner base layer 142 is a crystalline region of the base layer 130c, which is extended in the lateral direction outwardly in the form of a highly conductive polycrystalline base connection layer 131.

In regard to the layer thicknesses of the individual layers of the layer stack 130 the situation is the same as in the case of the npn-transistor A. The Si layer 130a can be of a thickness of between 20 nm and 150 nm, preferably between 30 nm and 100 nm. The buffer layer 130b produced by means of differential epitaxy is of a thickness of between 5 nm and 70 nm, preferably between 10 nm and 50 nm. The base layer 130c is of a layer thickness of between 5 nm and 100 nm, preferably between 5 nm and 35 nm. The cap layer 130d is of a layer thickness of between 10 nm and 100 nm, preferably between 20 nm and 50 nm.

The base layer 130c of the pnp-transistor is made from Si or SiGe. As in the case of the npn-bipolar transistor A carbon can be incorporated during the epitaxy procedure in the buffer layers 130a and 130b or in the base layer 130c or in the cap layer 130d or in a plurality of those layers.

It is to be noted that the sequence of material given in the base layer stack 130 of the pnp-bipolar transistor B, occurs in the direction of growth in the same manner in the npn-transistor A in the outer portions 131a of the emitter as those functional layers are deposited at the same time. In the npn-transistor A the emitter layer 131a is structured and filled with silicon in the region of the emitter window in a subsequent step in the production process. Therefore the sequence of materials of the base layer stack 130 of the pnp-transistor B will be found again only in the outer layer portions of the emitter of the npn-transistor A.

In the pnp-transistor B, the T-shaped emitter 140 is deposited above the base layer stack 130 in an emitter window 141 delimited by lateral spacers 145. The vertical portion of the T-shaped emitter 140 is surrounded by a raised base connection region 42a which is deposited on the base layer stack 130 and which was laterally structured to produce the emitter window. There is an additional insulation layer 136 for insulation of the monocrystalline region of the base layer stack 130 in the immediate proximity of the emitter window 141. The layer 136 laterally directly adjoins the spacers 145 and extends laterally at least in part over the monocrystalline region of the layer stack 130. A polysilicon layer 137 laterally adjoins the spacer 145 and covers the insulation layer 136. The polysilicon layer 137 is an auxiliary layer which serves for structuring of the insulation layer 136.

An insulation layer 146 is provided for insulation of the transverse bar of the T-shaped emitter 141 from the base connection region 42a. Laterally the transverse bar is insulated at the side walls with a spacer comprising a double layer SiO$_2$-Si$_3$N$_4$ 24.

Below the emitter window the collector 110 has an SiC doping 118 which also extends into the Si layer 130a.

For insulation of the collector 110 of the pnp-transistor B, provided beneath the collector is an insulation doping region 116 which is n-doped. The insulation doping region 116 and the collector 110 form a pn-junction 115 which is laterally delimited by the field insulation regions 2 which define the active region of the pnp-transistor B. The pn-junction 115 is therefore disposed at a lesser depth than the bottom of the shallow insulation regions 2, in the direction towards the interior of the substrate.

The collector doping 115 is provided at a comparatively slight depth. That provides that the collector doping is laterally restricted to the region which is within the field insulation regions 2. In that way the parasitic capacitance between collector and substrate is kept comparatively low by virtue of the small area of the pn-junction between the collector doping 115 and the insulation doping 116. In combination with insulation doping 116 as well as the well 4 and the contact region 112, that provides a collector arrangement which has low capacitance and low resistance and which is equal to the above-described previously known SOI variant from El-Kareh et al and markedly improves the corresponding properties of the device from Wilson et al. As a result therefore the high-frequency properties of the pnp-transistor B are substantially improved thereby.

Adjacent to the active bipolar transistor region of the pnp-collector B on the side of the collector connection is a contact region in an active region of comparatively slight lateral extent. The contact region 112 has an n-doped well 4 and a doping region 114 which is provided near the substrate surface and which is closed upwardly by a silicide layer 50. By means of that structure it is possible to keep down the connection resistance. In addition to an n-well it is also possible to use in the preferred region an n-doping which in certain CMOS technologies serves for the electrical insulation of n-MOS transistors. That additional doping is not shown in FIG. 1.

The p-doping 114 which is shallower in relation to the insulation doping 116 is used both as a collector for the pnp-transistor and also as a low-ohmic connection to the collector contact region which is later produced.

The depth of the doping profile 115 is so adjusted that the pn-junction is no deeper relative to the subjacent n-insulation doping 116 than the lower edge of the field insulation regions 2. The pnp-transistor B is electrically insulated from the substrate 1 by means of the n-insulation doping 116.

The lateral boundary of the doping 115 by the field insulation regions 2 and a preferably low maximum concentration of the n-insulation doping 116 in the space charge zone region relative to the collector ensures low capacitance values between the collector of the pnp-transistor and the lateral or substrate-side surroundings.

In addition an aim is to achieve a low connection resistance in respect of the n-insulation doping 116. For that purpose an n-well region 4 with associated contact region 112 is arranged in lateral relationship. An additional reduction in the connection resistance of the n-insulation doping 116 can be achieved by enclosing the n-insulation doping 116 on two, three and four sides, by means of the n-well region 4 and corresponding contact regions 112.

Example 2

Reference will now be made to FIGS. 2 through 8 to describe a process for the production of the semiconductor device according to the invention comprising complementary bipolar transistors with an epitaxial base. In addition in the example set forth here MOS transistors are also produced on one and the same substrate wafer besides complementary bipolar transistors.

Figure 2:
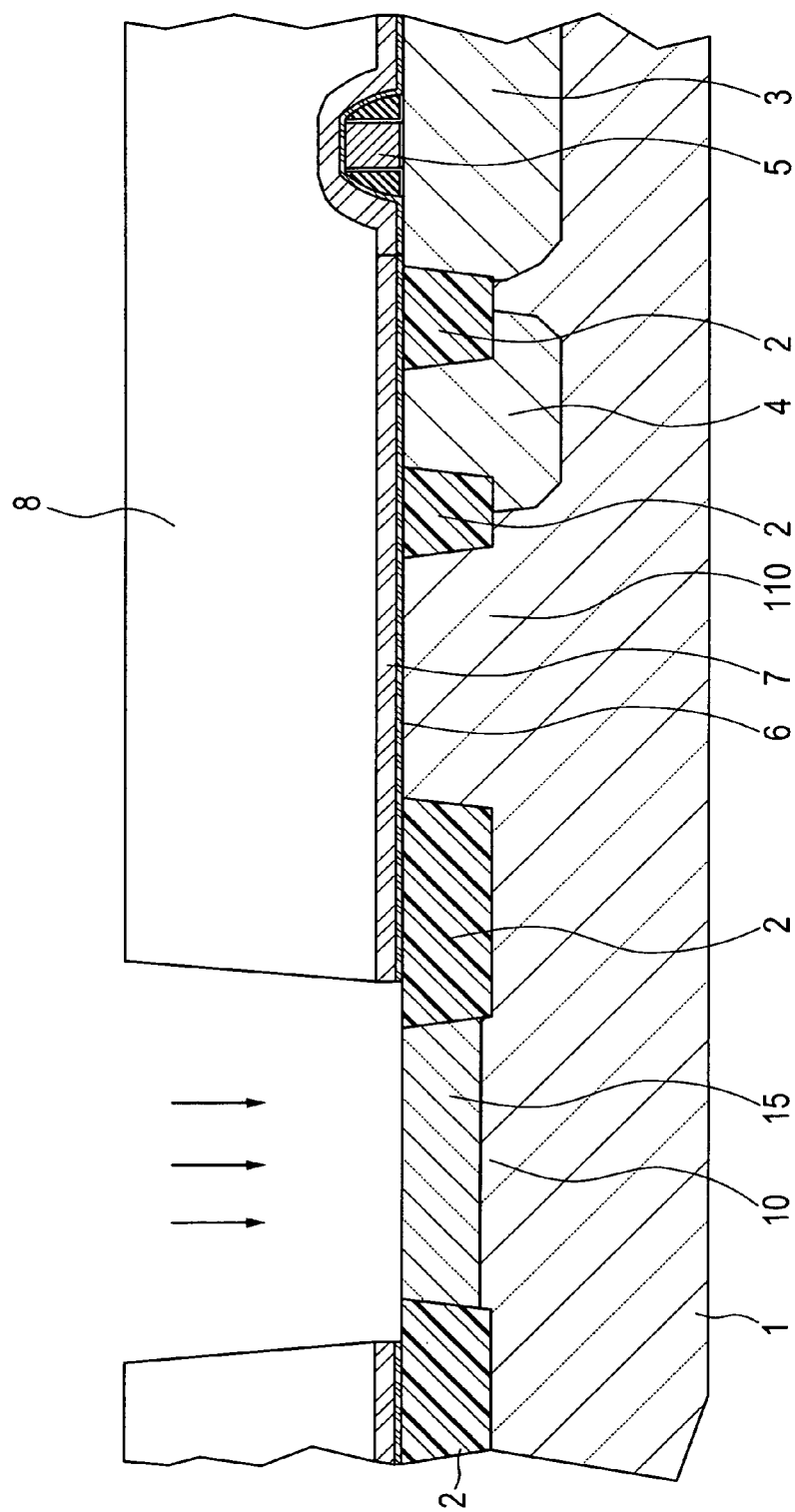
FIG. 2 shows a cross-section of the complementary bipolar transistors according to the invention during production in a BiCMOS process.

FIG. 2 shows a snapshot during a first masking step for the production of complementary bipolar transistors. The basis for production is formed by a substrate 1 (FIG. 2) which preferably includes a monocrystalline p$^-$-conducting (low p-conducting doping) silicon which is as high-ohmic as possible. The processing procedure for the substrate 1 begins with the production of the field insulation regions 2. In the present embodiment so-called shallow trenches are used as the field insulation regions. Selected regions have been doped by implantation in the further course of the production process. On those regions, referred to as the well regions, complementary (C)MOS transistors are produced using conventional methods. In the embodiment by way of example, an MOS transistor 5 is shown over a well region 3 in FIGS. 2 through 8. FIG. 2 shows the MOS transistor 5 after the gate spacer etching operation. As will be described in greater detail hereinafter well regions can also be used to secure the function of the complementary bipolar transistors. The n-well region 4 is provided for that purpose in this example.

After etching of the gate spacers the procedure is continued with the deposit of an $SiO_2/Si_3N_4$ layer stack 6, 7. That layer stack protects the CMOS transistors from the effect of various process steps during manufacture of the complementary bipolar transistors. All process steps, reckoned from deposit of the layer stack 6, 7 to the removal thereof, are referred to hereinafter as the bipolar module.

The protection layer stack 6, 7 over the active region 10, the transistor region of the npn-transistor, is opened by means of a lacquer mask 8 and usual anisotropic dry etching processes. An n-doping 15 is then introduced into the active region 10 by implantation. Implantation of the n-doping 15 can be effected prior to removal of the lacquer mask 8 or subsequently thereto if the thickness of the layer stack 6, 7 is sufficient to keep the implanted ions away from the covered regions.

Figure 3:
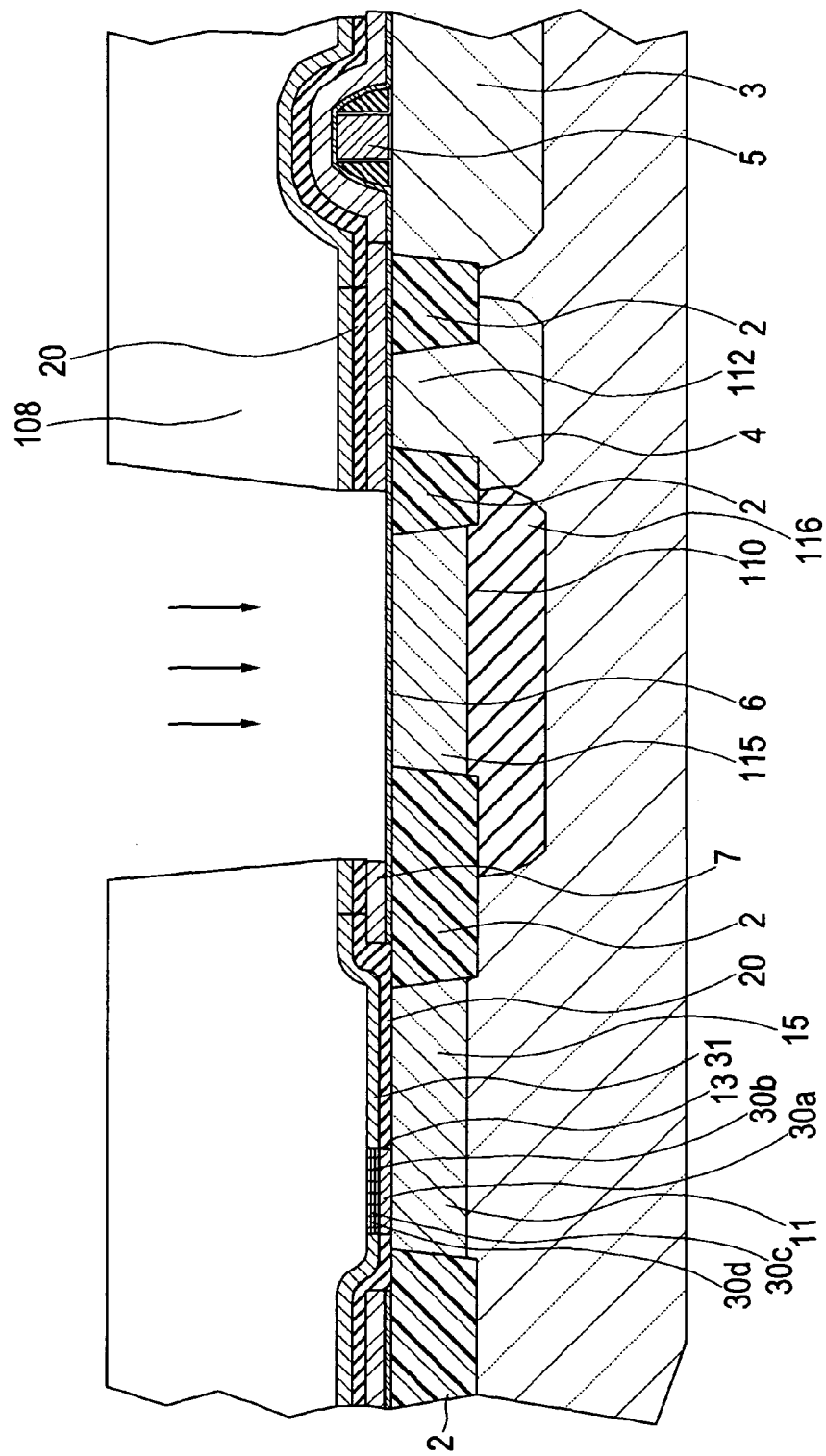
FIG. 3 shows a cross-section of the complementary bipolar transistors according to the invention during production in a BiCMOS process.

The result of subsequent process steps is shown in FIG. 3. Those process steps will now be described. After removal of the lacquer mask 8 (see FIG. 2), an $SiO_2$ layer 20 (FIG. 3), from which the insulation regions of second kind are produced, is deposited over the entire area. By means of a lacquer mask (not shown in FIG. 3) and known dry etching processes a window 13 is opened over the collector region 11 of the npn-transistor. In order to avoid damage to the Si surface in the dry etching operation, a residual oxide layer is firstly retained over the substrate surface. That residual oxide layer is removed with usual wet etching processes prior to the epitaxy step which then follows, to produce the npn-base.

The epitaxy step begins with the selective deposit of the layer 30a, the selective buffer layer, and is continued with differential deposit steps in which the differential buffer layer 30b, the SiGe base layer 30c doped in situ with boron and the cap layer 30d as well as on amorphous layers the polycrystalline layer 31 are produced.

FIG. 3 shows a status in the procedure in which the active region 110, the pnp-transistor region, is opened by means of a lacquer mask 108. Known dry etching processes are used to remove a layer stack comprising the poly-Si layer 31, the $SiO_2$ layer 20 and the $Si_3N_4$ layer 7 over the pnp-transistor region 110. The dry etching process is stopped on the $SiO_2$ layer 6 to protect the substrate surface.

The lacquer mask is also used to introduce into the pnp-transistor region 110 a p-doping 115 and an n-doping 116 which is deeper, that is to say arranged further towards the interior of the substrate in comparison with the p-doping 115. The n-doping 116 is also referred to hereinafter as insulation doping. The p-doping 115 which is shallower in relation to the n-doping is used both as the collector of the pnp-transistor and also as a low-ohmic connection to the collector contact region which is produced later.

The depth of the doping profile 115 is so adjusted that the pn-junction in relation to the subjacent n-insulation doping 116 is not deeper than the lower edge of the field insulation regions 2. The pnp-transistor is electrically insulated from the substrate 1 by means of the n-insulation doping 116.

Jointly with the collector doping 115, a further implant is preferably introduced, which at least partially amorphises the collector region. That can permit low-defect annealing of the implant damage at a sufficiently low temperature, preferably lower than 700° C. The influence on doping profiles which have already been introduced, in particular on the base profile of the npn-transistor, is kept low in that case.

Lateral delimitation of the doping 115 by the field insulation regions 2 and a preferably low concentration of the n-insulation doping 116 in the space charge zone relative to the collector 115 ensures low capacitance values between the collector of the npn-transistor and the lateral or substrate-side surroundings.

An additional aim is a low connection resistance in respect of the n-insulation doping 116. For that purpose an n-well region 4 with associated contact region 112 is arranged laterally. An additional reduction in the connection resistance of the n-insulation doping 116 can be achieved by enclosing the h-insulation doping 116 on two, three and four sides by means of the n-well region 4 and corresponding contact regions 112.

Figure 4:
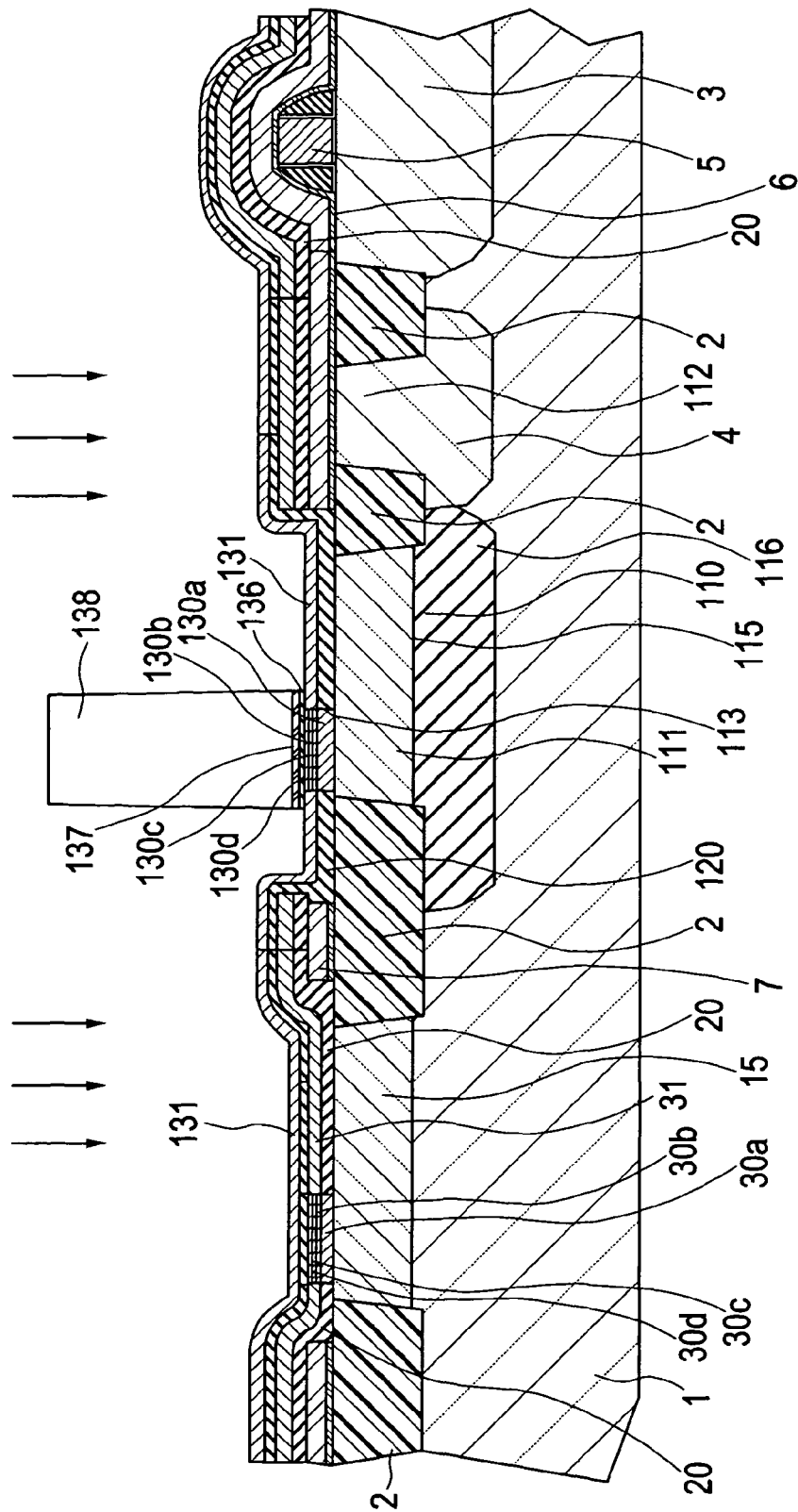
FIG. 4 shows a cross-section of the complementary bipolar transistors according to the invention during production in a BiCMOS process.

The process steps now described hereinafter accordingly result in a cross-sectional image as shown in FIG. 4. After removal of the lacquer mask 108 (FIG. 3), the SiO$_2$ layer 6 is removed by a wet chemical procedure using usual methods over the pnp-transistor region 110. An SiO$_2$ layer 120 is then deposited over the entire area at the surface, with the insulation regions of third kind being formed from the layer 120. The insulation regions of third kind 120 are opened by means of a lacquer mask (not shown in FIG. 4) in a window 113 over the collector region 111 of the pnp-transistor by means of known dry etching processes. Similarly to the procedure prior to the above-described epitaxy step for production of the npn-base, after the dry etching step a residual oxide layer (not shown in FIG. 4) remains, which is removed by means of wet-chemical processes prior to the epitaxy operation for the base of the pnp-transistor.

The epitaxy step in which the pnp-base is produced comprises the succession of selective and differential epitaxy. Firstly the selective buffer layer 130a is produced in the window 113 over the pnp-collector region 111, then the differential buffer layer 130b, then the SiGe base layer 130c, which is doped in situ with phosphorus, of the pnp-transistor, and finally the cap layer 130d. During the differential epitaxy step the polycrystalline 131 grows on the insulation region of third kind 120.

The procedure is continued with the deposit of a layer stack 136, 137 comprising SiO$_2$ and amorphous (a-)Si. The a-Si layer 137 on the regions which have been exposed free are removed by means of the lacquer mask 138 shown in FIG. 4, employing usual dry etching processes. At that location preferably n-dopant can be introduced by implantation into the regions not masked by the lacquer. That doping serves to reduce the connection resistance of the outer base region of the pnp-transistor. It is also useful for reducing the emitter resistance of the npn-transistor as the polycrystalline layer 131 is also used as a connection region for the npn-emitter.

Figure 5:
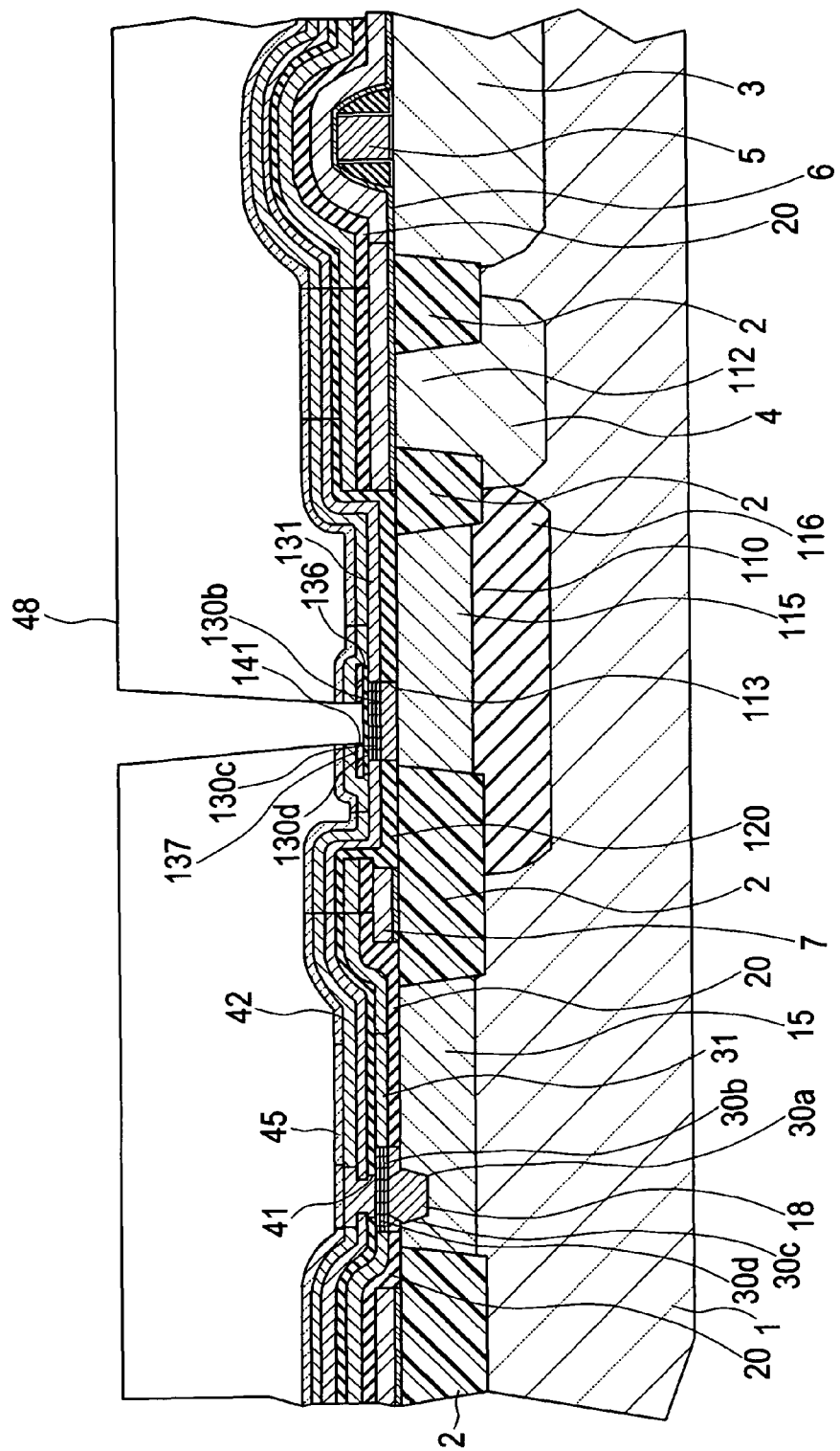
FIG. 5 shows a cross-section of the complementary bipolar transistors according to the invention during production in a BiCMOS process.

The processing steps which lead from the snapshot shown in FIG. 4 to the status shown in FIG. 5 are described hereinafter. After removal of the lacquer layer 138 (FIG. 4), emitter windows 41 (FIG. 5) over the npn-transistor region are opened by means of a further lacquer mask (not shown in FIG. 5). For that purpose the polysilicon layer 131 is removed with a dry etching step in the regions which have been exposed to free them of lacquer, with an etching stop, on the SiO$_2$ layer 120. Prior to deposit of an n-doped polysilicon layer, the npn-emitter layer 42, the SiO$_2$ layer 120 can be removed completely by means of wet-chemical processes or initially partially by means of dry etching and then by wet-chemical methods.

So-called SIC doping 18 of the npn-collector region by means of implantation (SIC: selectively implanted collector) can be effected prior to or after the removal of the lacquer mask (not shown in FIG. 5). Adequate shielding of the regions outside the emitter window during the implantation operation is crucial in terms of the choice of the sequence of lacquer removal and introduction of the SIC doping 18.

After the Si surface over the cap layer 30d in the npn-emitter window 41 is exposed deposit of the npn-emitter layer 42 which is doped in situ is effected. The deposit conditions can also be so selected in accordance with known processes that epitaxial growth occurs on monocrystalline Si surfaces. The npn-emitter layer 42 is covered with an SiO$_2$ layer 45.

The pnp-emitter window 141 is produced by means of the structured lacquer mask 48 (FIG. 5) after the removal of a layer stack comprising SiO$_2$ layer 45, npn-emitter layer 42 and polysilicon layer 137, by means of dry etching processes. The dry etching procedure is carried out in such a way in that case that the SiO$_2$ layer 136 is at least partially retained. FIG. 5 shows the processing status achieved up to that process step.

SIC doping of the pnp-collector region by means of implantation can be effected prior to or after removal of the lacquer mask (not shown in FIG. 5).

Further process steps are described hereinafter with reference to FIG. 6. In the further course of the procedure, so-called inside spacers 145 (FIG. 6) comprising SiO$_2$ are produced using usual methods at the side walls of the pnp-emitter window 141 and a residual SiO$_2$ layer which remains after the spacer etching operation over the cap layer 130d of the pnp-transistor is removed by a wet chemical procedure.

The pnp-emitter layer 142 is now produced in a subsequent epitaxy step. In that respect it is possible to use deposit conditions for differential epitaxy but also for selective epitaxy or for both variants. Preferably the aim is in situ doping with boron.

Figure 6:
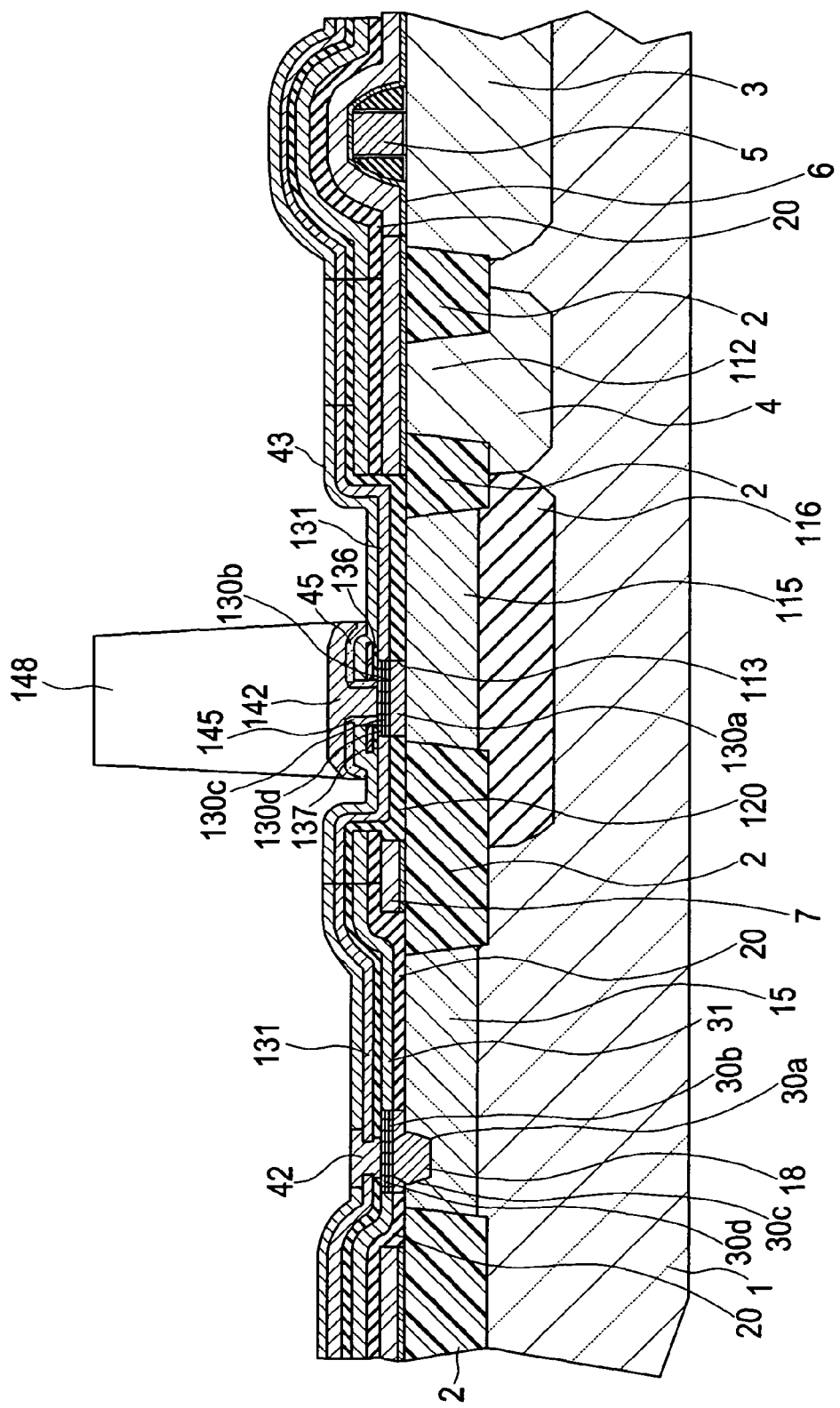
FIG. 6 shows a cross-section of the complementary bipolar transistors according to the invention during production in a BICMOS process.

FIG. 6 further shows a lacquer mask 148, by means of which the pnp-emitter layer 142 as well as the SiO$_2$ layer 45 are removed in the regions which have been freed from lacquer, in dry etching steps in the further course of the procedure.

Figure 7:
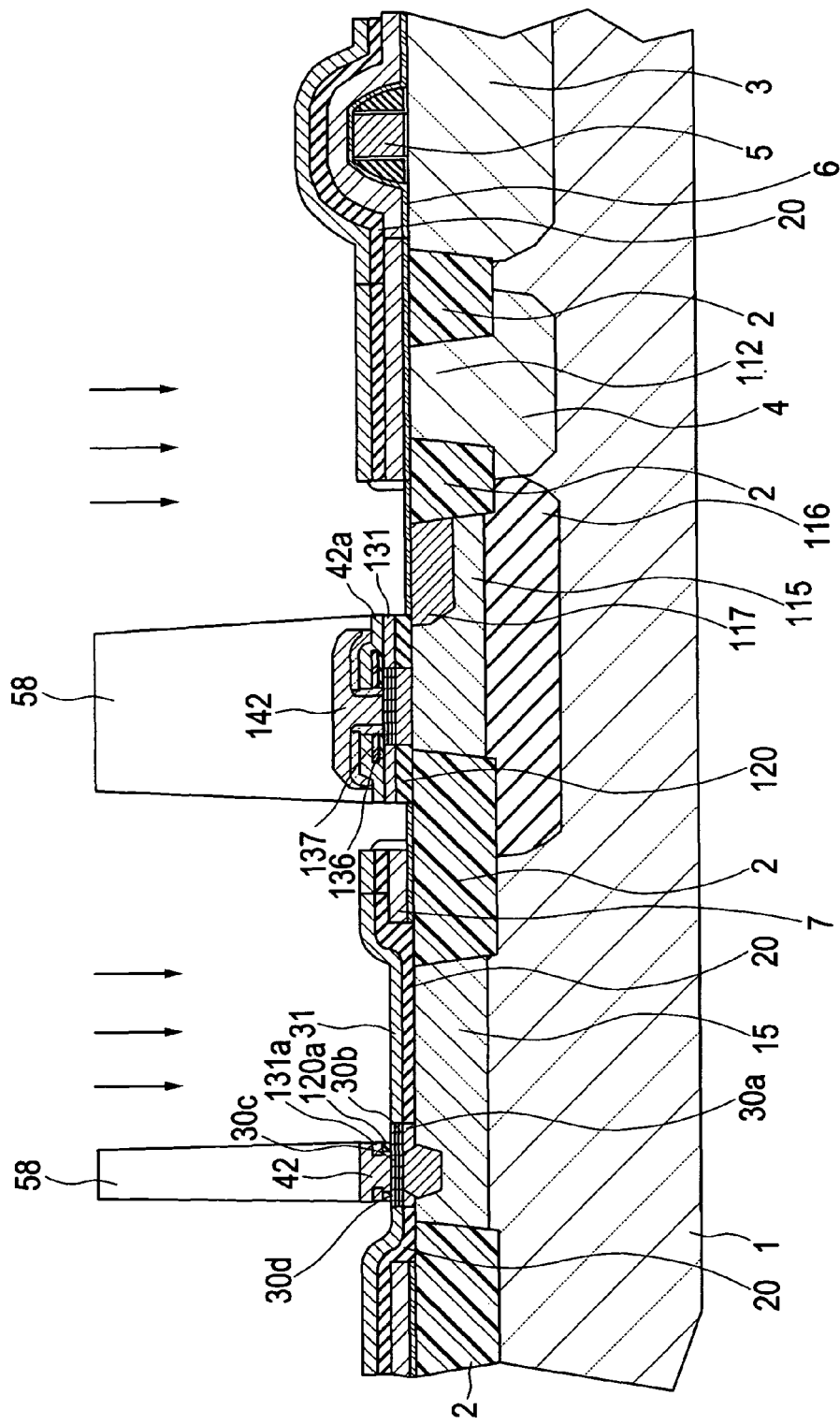
FIG. 7 shows a cross-section of the complementary bipolar transistors according to the invention during production in a BiCMOS process.

Further process steps are described hereinafter with reference to FIG. 7. A further lacquer mask 58 is used in order to structure the regions for the npn-emitter contact and the pnp-base contact region as shown in FIG. 7. FIG. 7 shows a status in which the layer stack comprising the npn-emitter layer 42 and the polysilicon layer 131 is already removed by means of a dry etching step in the regions which are not covered with lacquer. That etching step involves using those known processes which remove silicon with a high level of selectivity in relation to the subjacent SiO$_2$.

The SiO$_2$ layer 120 is completely or partially removed using a second dry etching step. Prior to removal of the lacquer mask 58 an implantation step of p-type is carried out, the aim being to achieve p-conductivity of the following regions which is as high as possible: a) the polysilicon layer 31 which affords the npn-base contact region in a later structuring operation, and b) the pnp-collector contact region 117.

The last masking step within the bipolar module serves for structuring of the npn-base contact regions 31 which occur as a consequence of dry etching of the polysilicon layer 31.

Figure 8:
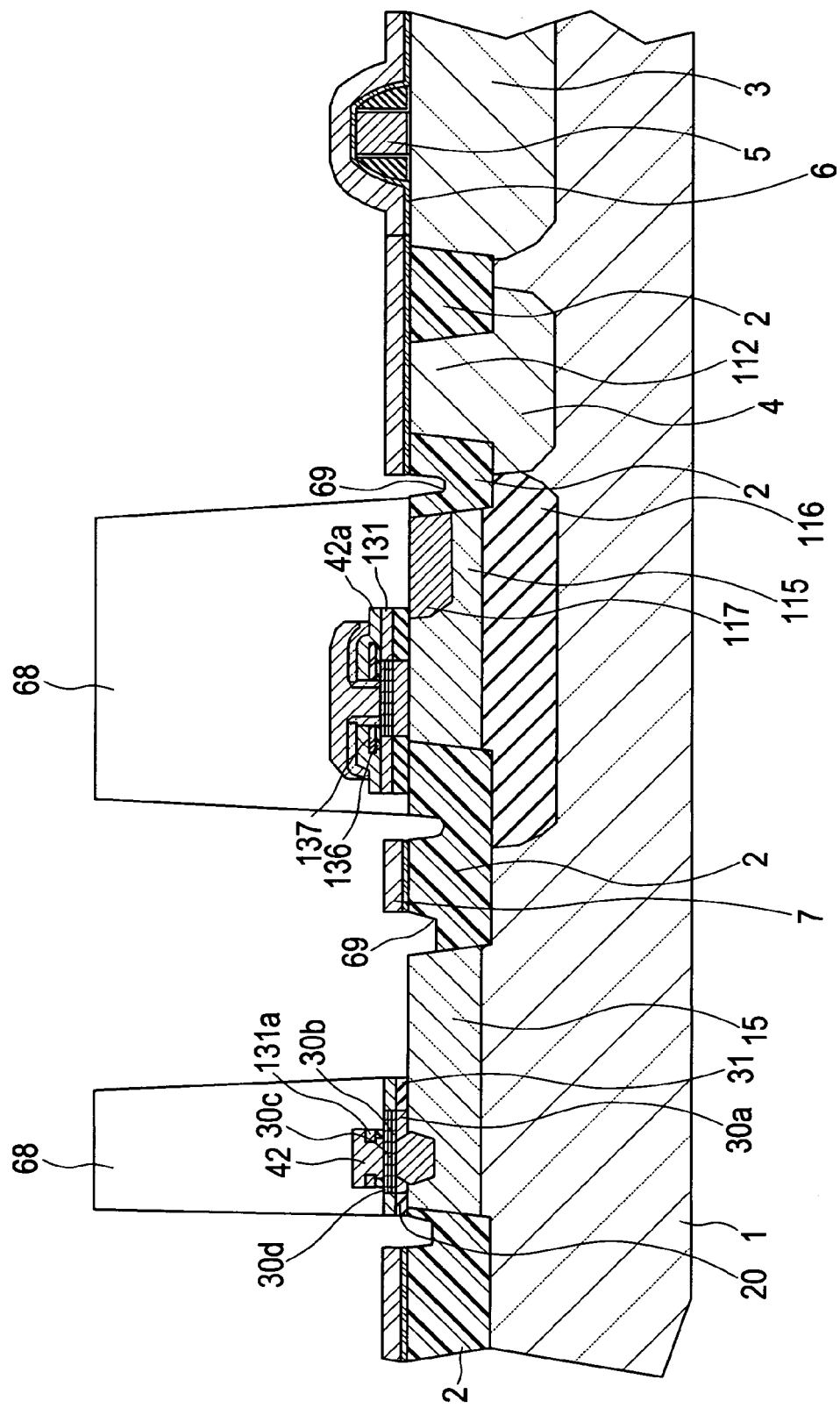
FIG. 8 shows a cross-section of the complementary bipolar transistors according to the invention during production in a BiCMOS process.

After a further dry etching step in which the SiO$_2$ layer 20 under the polysilicon layer 31 is removed, the result is the status shown in FIG. 8. A process was adopted for that etching step, which etches SiO$_2$ selectively both in relation to Si and also in relation to Si$_3$N$_4$, whereby it is possible to ensure an adequate over-etching time to avoid unwanted spacers. An over-etching time leads to the trench-like depressions 69 in the field insulation regions 2 comprising SiO$_2$. During the above-described etching steps the pnp-transistor region is protected by the lacquer mask 68.

The bipolar module terminates with removal of the lacquer layer 68 and the layer stack 7, 6.

The further procedure includes known processes of CMOS or BiCMOS technology. They include the implantation of source/drain regions for the MOS transistors by way of a lacquer mask.

Figure 9:
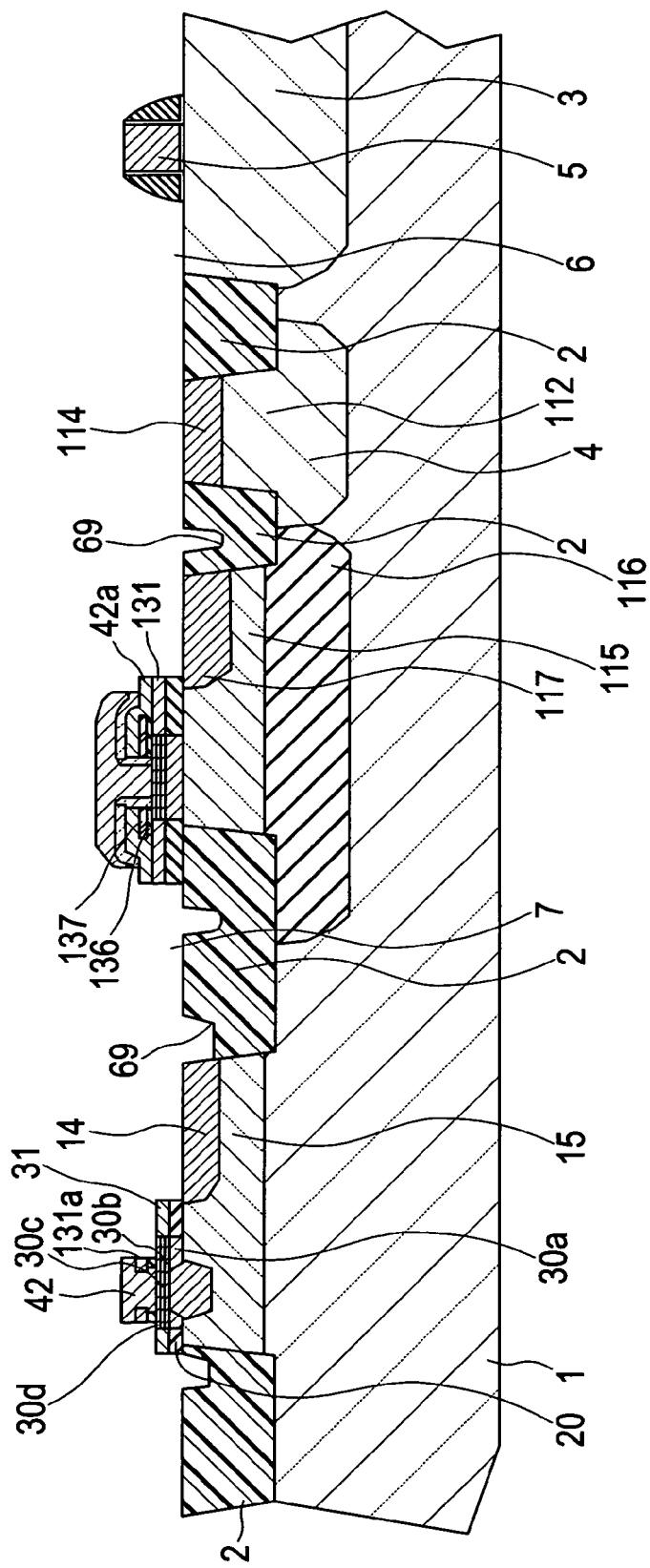
FIG. 9 shows a cross-section of the complementary bipolar transistors according to the invention during production in a BiCMOS process.

In the embodiment described herein the n-source/drain regions are also used as the collector connection doping 14 of the npn-transistor (FIG. 9). In that respect also the doping 114 is introduced into the contact region 112 in order to achieve a low-ohmic connection in relation to the n-insulation doping 116. It is also possible, but is not set forth here, for the pnp-collector doping in the contact region to be reinforced by means of the p-doping of the source/drain regions.

It may also be advantageous to use so-called extension regions for the MOS transistors. Implantation of those regions by means of a lacquer mask can be effected if previously the spacers of the MOS transistors, which preferably comprise $Si_3N_4$, are removed by a wet chemical process and selectively. In that case, prior to a usual silication step, new spacers are to be produced at the MOS gates. The step required for that purpose can be used at the same time as a silicide blocker on selected regions. Structuring of a special mask is necessary for that purpose.

The procedure is completed by typical process modules for wiring of the transistors. That includes known processes for deposit and structuring of metal layers and methods of depositing and planarising insulating intermediate layers.

Example 3

The procedure set forth in Example 2 is modified in such a way that, prior to the deposit of the layer stack 6, 7, no gate spacers are produced at the MOS gates. Production of gate spacers can be effected on the one hand with the removal of the layer 7 at the end of the bipolar module. In that respect it is not a wet etching process but a dry etching step that is required, unlike Example 2. On the other hand, as described in Example 2, a layer can be deposited after the bipolar module, which is used by means of a dry etching step for the gate spacer production operation. As set forth in Example 2 defined regions can be protected prior to that etching operation if a lacquer mask is structured beforehand.

Example 4

The bipolar module described in Example 2 can also be integrated into an SOI-MOS technology without effects on the semiconductor device according to the invention occurring.

Figure 10:
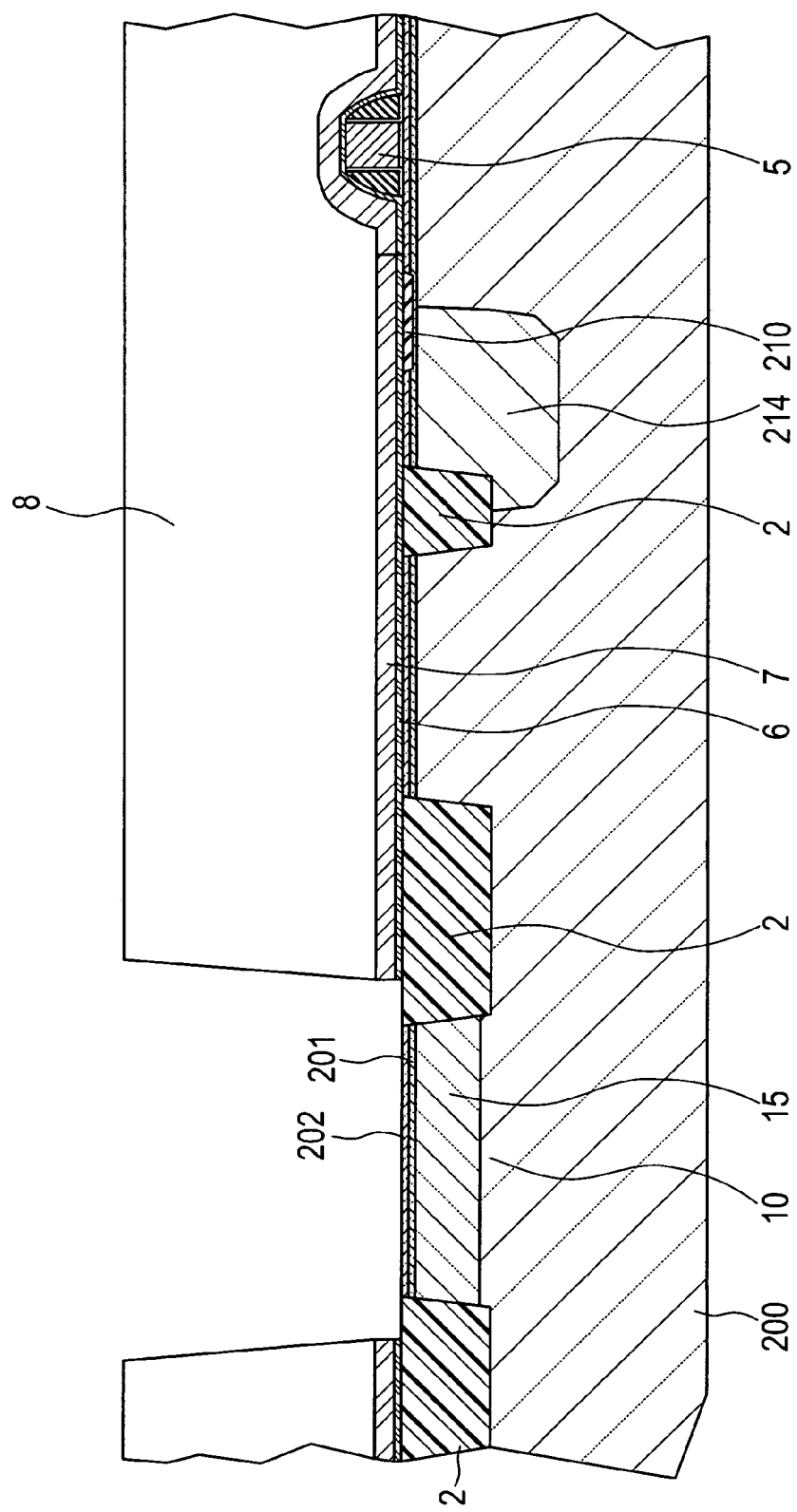
FIG. 10 shows a cross-section of the complementary bipolar transistors according to the invention during production in a BiCMOS process on SOI substrate wafer.

The starting situation prior to the bipolar module is shown in FIG. 10. Unlike Example 2; FIG. 2, the substrate wafer comprises bulk silicon 200, an $SiO_2$ layer 201 and an Si layer 202.

In addition the SOI-MOS transistors do not require any well regions in the bulk silicon 200. Typically the field insulation regions 210 of the SOI-MOS technology, referred to hereinafter as SOI field insulation regions, as considered in the bulk silicon direction, extend only to the $SiO_2$ layer 201. Besides the SOI field insulation regions 210, field insulation regions 2 which can comprise shallow or deep trenches are also produced. Those field insulation regions serve as described for lateral insulation of the collector regions.

The well region 214 can be produced with a special mask prior to the bipolar module. The result is shown in FIG. 10. It is however also possible for that step to be carried out subsequently to the bipolar module.

In the further course of the procedure the Si layer 202 is removed by means of dry etching processes over the npn-transistor region 10. That step can be effected prior to or after the removal of the lacquer mask 8 (FIG. 10).

Figure 11:
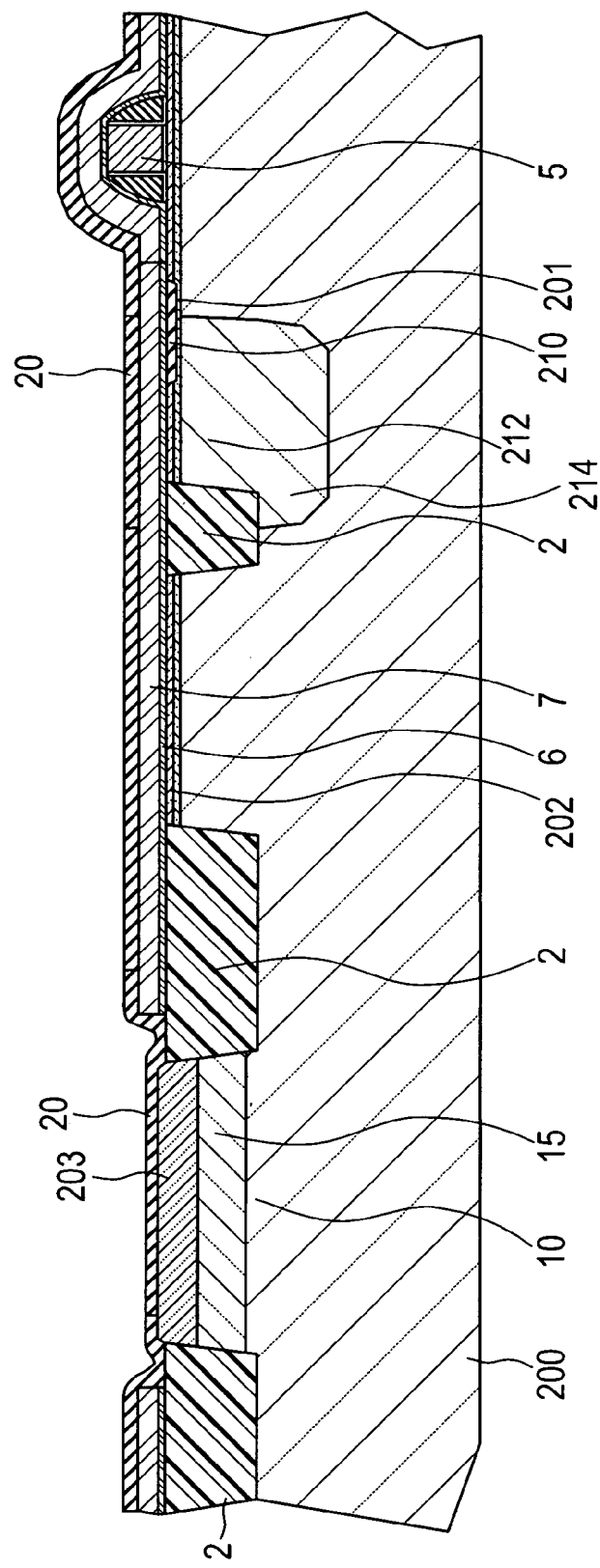
FIG. 11 shows a cross-section of the complementary bipolar transistors according to the invention during production in a BiCMOS process on SOI substrate wafer.

The $SiO_2$ layer 201 is removed by a wet chemical process. Then preferably the surface of the silicon in the npn-transistor region 10 is raised by means of a selective epitaxy step to approximately the height of the upper edge of the field insulation regions 2, giving the Si layer 203 (FIG. 11). It is however also possible for the surface of the bulk silicon 200 to be used as the surface of the later npn-collector region.

The position in the operating procedure and the implantation conditions for introducing the doping 15 are to be so adapted that the result at the end of the production process is similar profile configurations to Example 2. In that respect it is possible to also use multiple implantation operations, for example prior to or after the removal of the lacquer mask, after etching removal of the Si layer 202 or the $SiO_2$ layer 201, or after growth of the Si layer 203. The further procedure follows Example 2, with deposit of the $SiO_2$ layer 20 (FIG. 11). A similar procedure as when exposing and filling the npn-transistor region is to be used in relation to the pnp-transistor.

After the bipolar module is finished and prior to implantation of the n-source/drain regions, as a departure from Example 2, the contact region 212 is additionally to be exposed under the buried $SiO_2$ layer 201 (FIG. 11). It is possible for that purpose to use a special mask, by means of which the contact region 212 is exposed for connection of the n-insulation doping 116. In that case a combination of dry and wet etching can be used. In addition the well region 214 can also be produced in that masking step.

Figure 12:
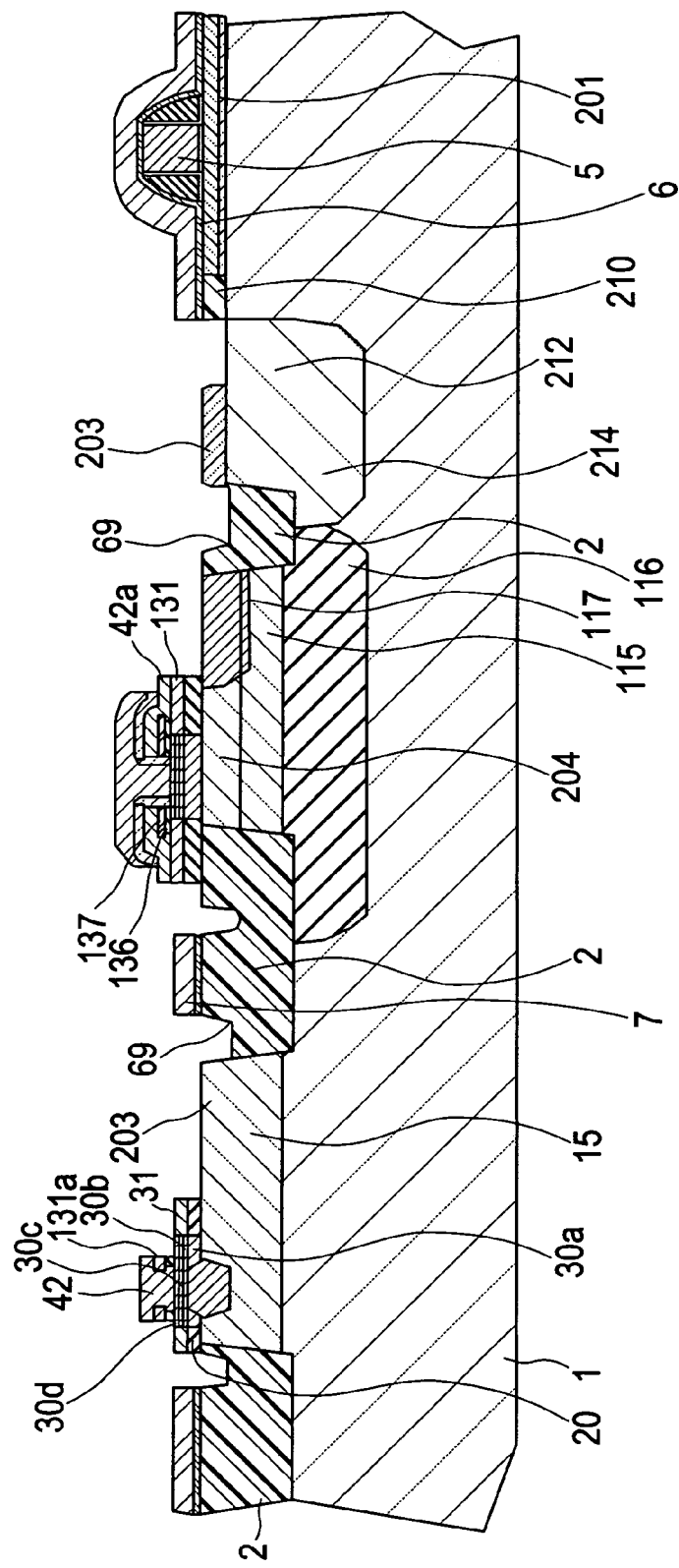
FIG. 12 shows a cross-section of the complementary bipolar transistors according to the invention during production in a BiCMOS process on SOI substrate wafer in accordance with an alternative process.

It is however also possible to expose the contact region 212 without a further mask. That variant is embodied in FIG. 12. In that case a collector contact region of the second transistor type is to be defined in that region by virtue of the layout. In that case, as described above, the well region 214 is to be produced by means of a special mask.

What is claimed is:

1. A complementary bipolar semiconductor (CBi) device, hereinafter referred to as a CBi semiconductor device,
    comprising a substrate of a first conductivity type and a number of active regions which are provided thereon and which are delimited in a lateral direction by shallow field insulation regions,
    in which vertical npn-bipolar transistors with an epitaxial base are arranged in a first subnumber of an active bipolar transistor regions and vertical pnp-bipolar transistors with an epitaxial base are arranged in a second subnumber of the active bipolar transistor regions,
    wherein either one transistor type or both transistor types have both a collector region and also a collector contact region in one and the same respective active bipolar transistor region,
    characterized in that in a first transistor type in which the conductivity type of the substrate is identical to that of the collector region an insulation doping region is provided between the collector region and the substrate, the insulation doping region being adapted to provide electrical insulation of a collector and the substrate,
    wherein in a region of an interface between the collector region and the insulation doping region there is a p-n junction which is arranged no deeper at an edge defined by the field insulation region of the active bipolar transistor region in question, alternatively in the whole of the respective active bipolar transistor region, than the lower edge of the shallow field insulation regions, and
    the collector region either of the first transistor type or both transistor types is delimited laterally by the shallow field insulation regions.

2. A CBi semiconductor device as set forth in claim 1 in which a dopant concentration of the insulation doping in a space charge region near the collector is less than $1 \times 10^{17}$ $cm^{-3}$.

3. A CBi semiconductor device as set forth in claim 1 in which the dopant concentration of the insulation doping in the space charge region near the collector is at a maximum $1 \times 10^{16}$ cm$^{-3}$.

4. A CBi semiconductor device as set forth in claim 1 in which the dopant concentration of the insulation doping in the space charge region near the collector is less than $1 \times 10^{15}$ cm$^{-3}$.

5. A CBi semiconductor device as set forth in claim 1 in which in the first transistor type in a laterally adjacent active region there are provided a well of a second conductivity type opposite to the first conductivity type and a contact region associated therewith of the second conductivity type.

6. A CBi semiconductor device as set forth in claim 1 in which a dopant dose of the well (4) is between $5 \times 10^{12}$ cm$^{-2}$ and $5 \times 10^{14}$ cm$^{-2}$.

7. A CBi semiconductor device as set forth in claim 1 in which the dopant dose of the well is restrictedly between $1 \times 10^{13}$ cm$^{-2}$ and $2 \times 10^{14}$ cm$^{-2}$.

8. A CBi semiconductor device as set forth in claim 5 in which the well is a well produced in an MOS process of the second conductivity type.

9. A CBi semiconductor device as set forth in claim 1 in which the dopant concentration of the contact region is between $1 \times 10^{17}$ cm$^{-3}$ and $1 \times 10^{21}$ cm$^{-3}$.

10. A CBi semiconductor device as set forth in claim 5 in which the well and the substrate contact region laterally surround the insulation doping region at two, alternatively three, alternatively four sides.

11. A CBi semiconductor device as set forth in claim 1 in which a maximum dopant concentration in the collector contact region of the first transistor type or a second transistor type is between $1 \times 10^{18}$ cm$^{-3}$ and $5 \times 10^{20}$ cm$^{-3}$.

12. A CBi semiconductor device as set forth in claim 1 in which the first transistor type or the second transistor type or both transistor types have an inner base region, below which is arranged a second collector region of either the same or approximately the same lateral extent as the inner base region, which second collector region with the same conductivity type is more highly doped than at least one portion, adjoining the second collector region, of the collector region.

13. A CBi semiconductor device as set forth in claim 1 in which the epitaxial base includes a base layer stack with a plurality of layers which are monocrystalline in the inner base region and polycrystalline in portions which in a lateral direction are outside the inner base region and are referred to hereinafter as a base contact region.

14. A CBi semiconductor device as set forth in claim 13 in which the base layer stack contains a base layer which is made either from silicon or from silicon-germanium and which is of a thickness of between 1 and 100 nm, in particular between 1 and 35 nm.

15. A CBi semiconductor device as set forth in claim 13 in which the base layer stack includes a cover layer adjoining the base layer at an emitter side.

16. A CBi semiconductor device as set forth in claim 13 in which one or more of the layers of the base layer stack are doped with carbon.

17. A CBi semiconductor device as set forth in claim 1 in which an emitter either of the first transistor type or the second transistor type or both transistor types is of a T-shaped configuration.

18. A CBi semiconductor device as set forth in claim 14 in which a substrate-side portion of the base contact region, which portion is provided in the base layer stack of the first transistor type, is made from the same, simultaneously deposited polycrystalline semiconductor material as a base-side outer portion of a transverse bar of the T-shape of the emitter in the second transistor type.

19. A CBi semiconductor device as set forth in claim 14 in which an emitter-side vertical layer portion of the base contact region, which layer portion is provided in the base layer stack of the first transistor type, is made from the same simultaneously deposited polycrystalline semiconductor material as a contact-side vertical layer portion of the transverse bar of the T-shape of the emitter in the second transistor type.

20. A CBi semiconductor device as set forth in claim 13 in which in the first transistor type a polycrystalline base contact region in the base layer stack has an interface which extends in parallel relationship with a substrate surface and along which grain boundaries of here mutually adjoining base-side and emitter-side, polycrystalline, vertical layer portions are oriented, and in the second transistor type the emitter has an interface which extends parallel to the substrate surface and along which grain boundaries of here mutually adjoining base-side and contact-side, polycrystalline, vertical layer portions are oriented.

21. A CBi semiconductor device as set forth in claim 1 in which the shallow field insulation regions are in the form of shallow trenches.

22. A CBiMOS or CBiCMOS semiconductor device as set forth in claim 1 with additionally at least one MOS semiconductor component or with complementary MOS semiconductor components.

23. A CBi or CBiMOS or CBiCMOS semiconductor device as set forth in claim 1 in which the substrate is p-conducting and the first transistor type is a pnp-transistor and a second transistor type is an npn-transistor.

* * * * *